United States Patent
Kim et al.

(10) Patent No.: US 12,095,056 B2
(45) Date of Patent: Sep. 17, 2024

(54) BATTERY MANAGEMENT APPARATUS AND ENERGY STORAGE SYSTEM HAVING THE SAME

(71) Applicants: HYUNDAI MOTOR COMPANY, Seoul (KR); KIA CORPORATION, Seoul (KR); The Industry & Academic Cooperation in Chungnam National University (IAC), Daejeon (KR)

(72) Inventors: Sung Keun Kim, Incheon (KR); Eui Jun Kim, Seongnam-si (KR); Deokhun Kang, Anyang-si (KR); Jonghoon Kim, Daejeon (KR)

(73) Assignees: Hyundai Motor Company, Seoul (KR); Kia Corporation, Seoul (KR); THE INDUSTRY & ACADEMIC COOPERATION IN CHUNGNAM NATIONAL UNIVERSITY (IAC), Daejeon (KR)

( * ) Notice: Subject to any disclaimer, the term of this patent is extended or adjusted under 35 U.S.C. 154(b) by 479 days.

(21) Appl. No.: 17/406,462

(22) Filed: Aug. 19, 2021

(65) Prior Publication Data
US 2022/0077514 A1   Mar. 10, 2022

(30) Foreign Application Priority Data

Sep. 7, 2020  (KR) .................. 10-2020-0113914
Jul. 13, 2021 (KR) .................. 10-2021-0091505

(51) Int. Cl.
*H01M 10/48* (2006.01)
*B60L 3/00* (2019.01)
(Continued)

(52) U.S. Cl.
CPC ......... *H01M 10/482* (2013.01); *B60L 3/0046* (2013.01); *G01R 31/3648* (2013.01);
(Continued)

(58) Field of Classification Search
CPC ............. H01M 10/482; H01M 10/486; H01M 2010/4271; H01M 10/425;
(Continued)

(56) References Cited

U.S. PATENT DOCUMENTS 11,567,141 B2 *  1/2023  Kim ..................... G01R 31/388
11,774,508 B2 * 10/2023  Ko ........................ G01R 31/392
                                                                  320/137
(Continued)

FOREIGN PATENT DOCUMENTS

EP        3040733 A1     7/2016
JP      2002008733 A     1/2002
(Continued)

OTHER PUBLICATIONS

Extended European Search Report dated Feb. 1, 2022, issued in corresponding European Patent Application No. 21192937.7.
(Continued)

*Primary Examiner* — M Baye Diao
(74) *Attorney, Agent, or Firm* — Morgan, Lewis & Bockius LLP

(57) ABSTRACT

A battery management apparatus includes a plurality of battery cells connected to one another in at least one of a series connection or a parallel connection; a detector configured to detect electrical signals of the battery cells; a monitor configured to obtain the electrical signal for each of the battery cells and values of correlation coefficient corresponding to correlation results obtained based on the electrical signals, and to generate identification signals corresponding to the electrical signals of the battery cells based on the values of correlation coefficient and a reference value; and a storage configured to store the identification signals generated by the monitor for each of the battery cells. The monitor is configured to recognize a risk of failure of each
(Continued)

of the battery cells based on an accumulated number of identification signals stored in the storage for each of the battery cells.

12 Claims, 22 Drawing Sheets

(51) Int. Cl.
    *G01R 31/36*     (2020.01)
    *G01R 31/3842*     (2019.01)
    *H01M 10/42*     (2006.01)

(52) U.S. Cl.
    CPC ...... *G01R 31/3842* (2019.01); *H01M 10/486* (2013.01); *B60L 2240/547* (2013.01); *H01M 2010/4271* (2013.01)

(58) Field of Classification Search
    CPC ........... H01M 10/4257; H01M 10/488; H01M 2010/4278; B60L 3/0046; B60L 2240/547; G01R 31/3648; G01R 31/3842; G01R 31/396; G01R 31/392; Y02E 60/10
    USPC ........................................................ 320/112
    See application file for complete search history.

(56) References Cited

U.S. PATENT DOCUMENTS

| | | | | |
|---|---|---|---|---|
| 2005/0285445 | A1* | 12/2005 | Wruck | H02J 9/002 |
| | | | | 307/10.1 |
| 2013/0065093 | A1* | 3/2013 | White | G01R 31/3648 |
| | | | | 429/50 |
| 2014/0212730 | A1 | 7/2014 | Schaefer | |
| 2016/0125068 | A1* | 5/2016 | Dongieux | G06F 16/285 |
| | | | | 707/740 |
| 2016/0141894 | A1* | 5/2016 | Beaston | H02J 7/0014 |
| | | | | 320/103 |
| 2016/0169977 | A1 | 6/2016 | Fukuhara | |
| 2019/0235596 | A1 | 8/2019 | Lugo Beauchamp et al. | |
| 2020/0335211 | A1* | 10/2020 | Gopalakrishnan | A61B 5/24 |
| 2021/0257681 | A1 | 8/2021 | Takahashi et al. | |
| 2021/0408612 | A1* | 12/2021 | Kim | H01M 50/249 |
| 2021/0408615 | A1* | 12/2021 | Myers | H01M 10/425 |
| 2022/0176845 | A1* | 6/2022 | Lee | B60L 58/12 |
| 2022/0255142 | A1* | 8/2022 | Lim | G01R 31/3648 |

FOREIGN PATENT DOCUMENTS

| | | |
|---|---|---|
| KR | 10-1294169 B1 | 8/2013 |
| KR | 10-1551062 B1 | 9/2015 |
| KR | 10-1706717 B1 | 3/2017 |
| KR | 10-1930647 B1 | 3/2019 |
| SE | 1750706 A1 | 12/2018 |
| WO | 2019243950 A1 | 12/2019 |

OTHER PUBLICATIONS

Bing Xia et al. "A Correlation Based Detection Method for Internal Short Circuit in Battery Packs" 2017.

Xiaosong Hu et al. "Advanced Fault Diagnosis for Lithium-Ion Battery Systems" 2020.

* cited by examiner

BATTERY MANAGEMENT APPARATUS AND ENERGY STORAGE SYSTEM HAVING THE SAME

CROSS-REFERENCE TO RELATED APPLICATION(S)

This application claims the benefit of priority to Korean Patent Application Nos. 10-2020-0113914 and 10-2021-0091505, respectively filed on Sep. 7, 2020 and Jul. 13, 2021 in the Korean Intellectual Property Office, the disclosures of which are incorporated herein by reference.

TECHNICAL FIELD

The disclosure relates to a battery management apparatus for diagnosing overheating of a battery and an energy storage system having the same.

BACKGROUND

Renewable energy generation sources such as solar and wind power have the disadvantage of not being able to steadily obtain power depending on the weather. To this end, recently, a system that can store energy in a storage device in advance and use it at a required time has been utilized. This is called an energy storage system (ESS).

The energy storage system can be seen as a device that efficiently uses an electric energy by applying a storage technology to the characteristics of electricity consumed simultaneously with production.

A battery is used as a representative medium of the energy storage system. In this case, the battery may be a newly manufactured battery, or may be a battery that is reused after being used in another device.

The battery is a rechargeable and dischargeable secondary battery, and may be formed by connecting a battery module consisting of a plurality of cells in series and parallel to obtain necessary power.

The plurality of battery cells have a problem in that a relatively high current is input or output during charging or discharging, or a fire occurs in the battery cells due to a failure.

The information disclosed in the Background section above is to aid in the understanding of the background of the present disclosure, and should not be taken as acknowledgement that this information forms any part of prior art.

SUMMARY

An aspect of the disclosure is to provide a battery management apparatus for obtaining a value of a correlation coefficient for each battery cell based on electrical signals of a plurality of battery cells and predicting a failure of the battery cell based on the obtained correlation coefficient value and an energy storage system having the same.

Another aspect of the disclosure is to provide a battery management apparatus for obtaining a standardized score (Z-score) in response to the electrical signals based on the electrical signals of the plurality of battery cells, monitoring deviation characteristics of the battery cells based on the obtained Z-score, and determining a failure on the plurality of battery cells based on the monitoring result, and an energy storage system having the same are provided.

Additional aspects of the disclosure will be set forth in part in the description which follows and, in part, will be obvious from the description, or may be learned by practice of the disclosure.

According to an aspect of the disclosure, a battery management apparatus may include: a plurality of battery cells connected to one another in at least one of a series connection or a parallel connection; a detector configured to detect electrical signals of the plurality of battery cells; a monitor configured to obtain the electrical signal for each of the plurality of battery cells and values of correlation coefficient corresponding to correlation results obtained based on the electrical signals, and to generate identification signals corresponding to the electrical signals of the plurality of battery cells based on the values of correlation coefficient and a reference value; and a storage configured to store the identification signals generated by the monitor for each of the plurality of battery cells. The monitor may be configured to recognize a risk of failure of each of the plurality of battery cells based on an accumulated number of identification signals stored in the storage for each of the plurality of battery cells.

The detector may include at least one of a current detector configured to detect a current of each of the plurality of battery cells or a voltage detector configured to detect a voltage of each of the plurality of battery cells.

The battery management apparatus may further include a temperature detector configured to detect a temperature of at least one battery cell. The monitor may be configured to obtain at least one of a state of charge (SOC), a state of health (SOH), an internal resistance, and a capacity change corresponding to a voltage change of a battery based on the current, voltage, and temperature of each of the plurality of battery cells, and to obtain the values of the correlation coefficient between the plurality of battery cells based on at least one of the SOC, SOH internal resistance, and the capacity change corresponding to the voltage change of the battery.

The electrical signal may include a voltage signal. The monitor may be configured to obtain voltages of the plurality of battery cells based on the voltage signal of each of the plurality of battery cells, to obtain a total voltage based on the voltages of the plurality of battery cells, and to obtain the value of the correlation coefficient of each of the plurality of battery cells with respect to the total voltage.

The monitor may be configured to generate a first identification signal in response to the obtained value of the correlation coefficient is greater than or equal to a reference value, and to generate a second identification signal in response to the obtained value of the correlation coefficient is less than the reference value and store the second identification signal in the storage.

The monitor may be configured to recognize the risk of failure of the battery cell based on the accumulated number of second identification signals stored in the storage for each of the plurality of battery cells.

The monitor may be configured to obtain the value of the correlation coefficient using the electrical signals of the plurality of battery cells detected for a predetermined time.

The monitor may be configured to determine a repeatability and frequency of the accumulated number of second identification signals stored in the storage for each of the plurality of battery cells.

According to another aspect of the disclosure, an energy storage system includes: a battery including a plurality of battery cells connected to at least one of a series connection and a parallel connection; a detector configured to detect electrical signals of the plurality of battery cells; a battery management apparatus configured to obtain the electrical signal for each of the plurality of battery cells and values of correlation coefficient corresponding to correlation results obtained based on the electrical signals, to generate and store identification signals corresponding to the electrical signals of the plurality of battery cells based on the values of the correlation coefficient and a reference value, and to monitor a risk of failure of each of the plurality of battery cells based on an accumulated number of stored identification signals for each of the plurality of battery cells; a controller configured to control an output of warning information based on the risk of failure of each of the plurality of battery cells, and to block charge/discharge of the plurality of battery cells; and a display configured to display the warning information based on a control command of the controller.

The detector may include at least one of a current detector configured to detect a current of each of the plurality of battery cells or a voltage detector configured to detect a voltage of each of the plurality of battery cells.

The energy storage system may further include a temperature detector configured to detect a temperature of at least one battery cell. The battery management apparatus may be configured to obtain at least one of a state of charge (SOC), a state of health (SOH), an internal resistance, and a capacity change corresponding to a voltage change of a battery based on the current, voltage, and temperature of each of the plurality of battery cells, and to obtain the values of the correlation coefficient between the plurality of battery cells based on at least one of the SOC, SOH internal resistance, and the capacity change corresponding to the voltage change of the battery.

The electrical signal may include a voltage signal. The battery management apparatus may be configured to obtain voltages of the plurality of battery cells based on the voltage signal of each of the plurality of battery cells, to obtain a total voltage based on the voltages of the plurality of battery cells, and to obtain the value of the correlation coefficient of each of the plurality of battery cells with respect to the total voltage.

The energy storage system may further include a storage. The battery management apparatus may be configured to generate a first identification signal in response to the obtained value of the correlation coefficient is greater than or equal to a reference value, and to generate a second identification signal in response to the obtained value of the correlation coefficient is less than the reference value and store the second identification signal in the storage.

The battery management apparatus may be configured to recognize the risk of failure of each of the plurality of battery cells based on the accumulated number of second identification signals stored in the storage for each of the plurality of battery cells.

The battery management apparatus may be configured to determine the repeatability and frequency of the accumulated number of second identification signals stored in the storage for each of the plurality of battery cells.

The battery management apparatus may be configured to manage a battery module in which the plurality of battery cells are connected in series and in parallel.

The battery management apparatus may be configured to manage a battery rack including a plurality of battery modules connected in series and in parallel. Each battery module may include battery cells connected in series and in parallel.

According to another aspect of the disclosure, an energy storage system includes a battery including a plurality of battery cells connected to at least one of a series connection and a parallel connection; a detector configured to detect electrical signals of the plurality of battery cells; a battery management apparatus configured to obtain the electrical signal for each of the plurality of battery cells and values of correlation coefficient corresponding to correlation results obtained based on the electrical signals, obtain an average value and a standard deviation based on a value of voltage corresponding to the electrical signal for each of the plurality of battery cells, obtain a standardized score (Z-score) of each of the plurality of battery cells based on the value of voltage, the average value, and the standard deviation of each of the plurality of battery cells, generate identification signal corresponding to each of the plurality of battery cells based on the values of the correlation coefficient for each of the plurality of battery cells and the Z-score, and monitor a risk of failure of each battery cell based on the identification signal corresponding to each of the plurality of battery cells, a controller configured to control an output of warning information based on the risk of failure of each of the plurality of battery cells, and to block charge/discharge of the plurality of battery cells; and a display configured to display the warning information based on a control command of the controller.

The detector may include at least one of a current detector configured to detect a current of each of the plurality of battery cells or a voltage detector configured to detect a voltage of each of the plurality of battery cells.

The electrical signal may include a voltage signal; and the battery management apparatus is further configured to obtain voltages of the plurality of battery cells based on the voltage signal of each of the plurality of battery cells, obtain a total voltage based on the voltages of the plurality of battery cells, and obtain the value of the correlation coefficient of each of the plurality of battery cells with respect to the total voltage.

The battery management apparatus may be configured to generate a first identification signal when the value of the obtained correlation coefficient is greater than or equal to a reference value, and generate a second identification signal when the value of the obtained correlation coefficient is less than the reference value, and generate the first identification signal when the obtained Z-score is less than or equal to a reference Z-score, and generate the second identification signal when the obtained Z-score is greater than the reference Z-score.

The battery management apparatus may be configured to recognize the risk of failure of each of the plurality of battery cells based on the accumulated number of second identification signals for each of the plurality of battery cells.

BRIEF DESCRIPTION OF THE DRAWINGS

These and/or other aspects of the disclosure will become apparent and more readily appreciated from the following description of the embodiments, taken in conjunction with the accompanying drawings of which:

FIGS. 8C and 8D are graphs of an example of an experiment different from those of FIGS. 8A and 8B.

DETAILED DESCRIPTION

Figure 1A:
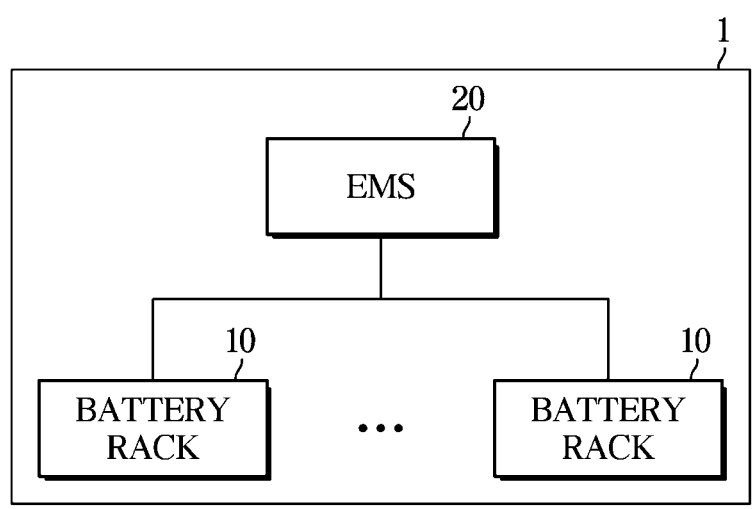
FIG. 1A is a view illustrating an energy storage system according to an embodiment.

Like reference numerals refer to like elements throughout the specification. Not all elements of the embodiments of the disclosure will be described, and the description of what are commonly known in the art or what overlap each other in the exemplary embodiments will be omitted. The terms as used throughout the specification, such as "~part," "~module," "~member," "~block," etc., may be implemented in software and/or hardware, and a plurality of "~parts," "~modules," "members," or "~blocks" may be implemented in a single element, or a single "~part," "~module," "~member," or "~block" may include a plurality of elements.

It will be further understood that the term "connect" and its derivatives refer both to direct and indirect connection, and the indirect connection includes a connection over a wireless communication network.

The terms "include (or including)" and "comprise (or comprising)" are inclusive or open-ended and do not exclude additional, unrecited elements or method steps, unless otherwise mentioned.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

It is to be understood that the singular forms "a," "an," and "the" include plural references unless the context clearly dictates otherwise.

Reference numerals used for method steps are merely used for convenience of explanation, but not to limit an order of the steps. Thus, unless the context clearly dictates otherwise, the written order may be practiced otherwise.

Hereinafter, an operation principle and embodiments of the disclosure will be described with reference to accompanying drawings.

Figure 1B:
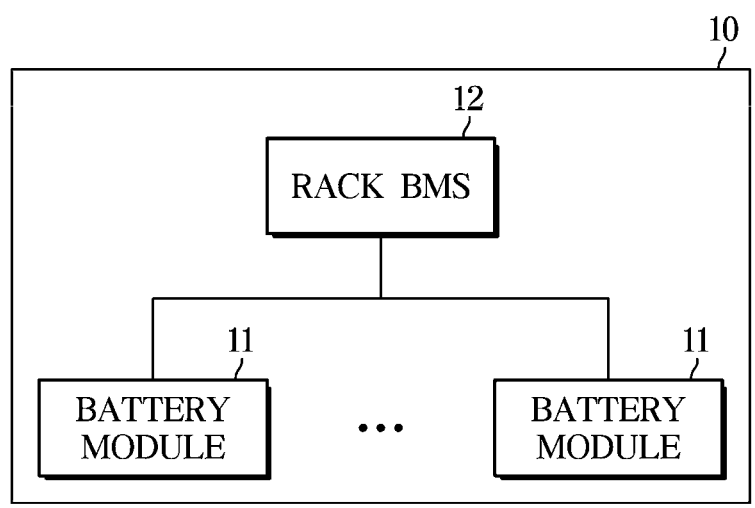
FIG. 1B is a view illustrating a battery rack in the energy storage system illustrated in FIG. 1A.
Figure 1C:
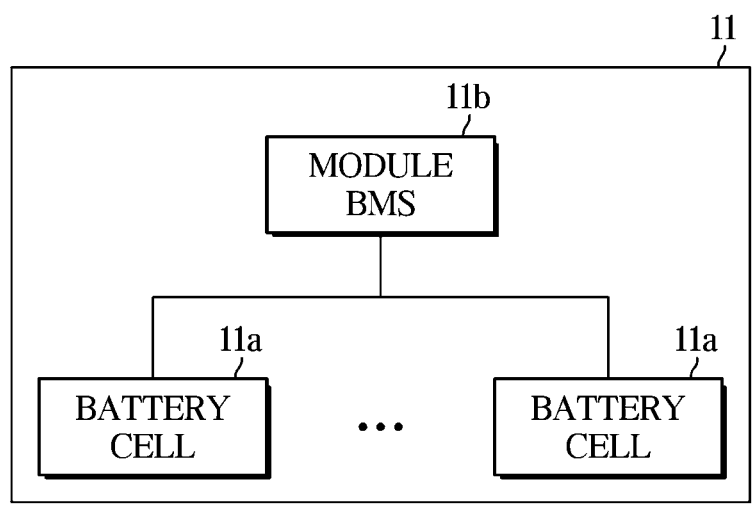
FIG. 1C is a view illustrating a battery module of the energy storage system illustrated in FIG. 1B.

FIG. 1A is a view illustrating an energy storage system according to an embodiment, FIG. 1B is a view illustrating a battery rack in the energy storage system illustrated in FIG. 1A, and FIG. 1C is a view illustrating a battery module of the energy storage system illustrated in FIG. 1B.

An energy storage system 1 is a system that stores energy and outputs energy so that the stored energy can be used when necessary.

For example, the energy storage system 1 may be applied to a new renewable energy technology or a smart grid technology.

Referring to FIG. 1A, the energy storage system 1 may include a plurality of battery racks 10 connected in parallel, and an energy management system (EMS) 20 for managing and controlling the plurality of battery racks 10.

Figure 2:
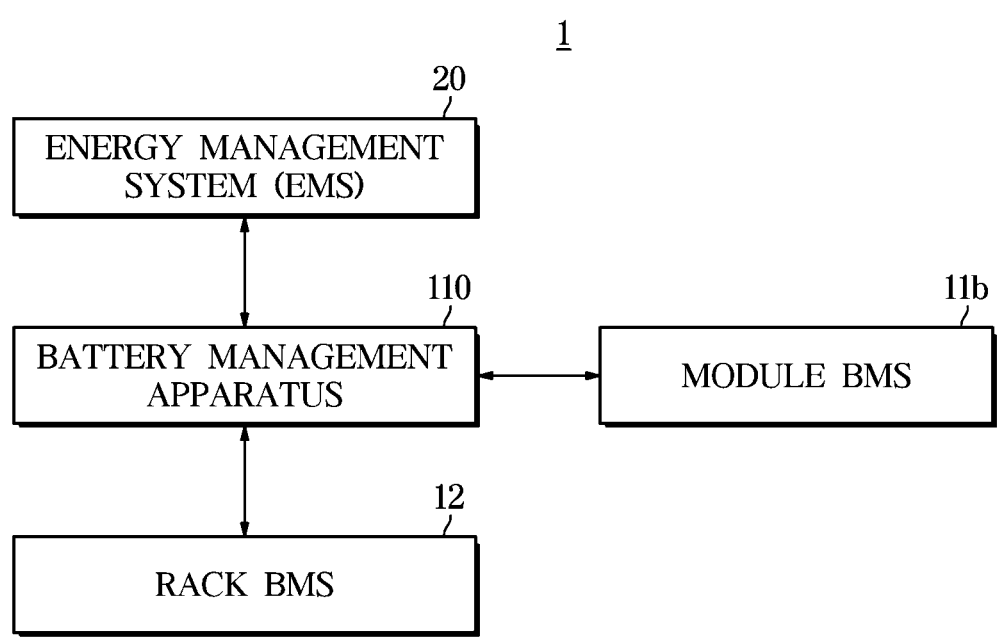
FIG. 2 is a view illustrating a configuration of an energy storage system according to an embodiment.

The EMS 20 may transmit rack monitoring information, such as a state of charge (SOC) and a state of health (SOH) of each battery rack 10, to a battery management apparatus 110 (see FIG. 2).

As illustrated in FIG. 1B, each of the plurality of battery racks 10 may include a plurality of battery modules 11 connected in series and in parallel. Here, the plurality of battery modules 11 may form one battery rack. Each of the plurality of battery racks 10 may include a rack management system 12 that manages and controls the plurality of battery modules 11.

As illustrated in FIG. 1C, each battery module 11 may include a plurality of battery cells 11a connected in series and in parallel. Here, the plurality of battery cells 11a may form one battery module.

Each of the plurality of battery modules 11 may include a module management system 11b that manages and controls the plurality of battery cells 11a.

The energy storage system 1 may further include a power converter that converts power supplied from the outside into power for charging the plurality of battery cells and supplies the converted power to the plurality of battery cells. Here, the power supplied from the outside may be power of an electrical grid.

As illustrated in FIG. 2, the energy storage system 1 may the battery management apparatus 110 for monitoring states of the plurality of battery cells 11a, the plurality of battery modules 11, and the plurality of battery racks 10.

That is, the battery management apparatus 110 may receive state information of the battery racks 10 from the EMS 20, receive state information of the battery modules 11 from the rack management system 12, receive state information about the plurality of battery cells 11a from the module management system 11b, and monitor the states of the battery cells 11a, the battery modules 11, and the battery racks 10 based on the received various information.

The energy storage system 1 may include the module management system 11b for managing the battery cells 11a, the rack management system 12 for managing the battery modules 11, and the EMS 20 for managing the battery racks 10, but may also include a single management system for managing the battery cells 11a, the battery modules 11, and the battery racks 10 by integrating the module management system 11b, the rack management system 12, and the EMS 20.

The battery management apparatus 110 provided in the energy storage system 1 may perform communication with the single management system, receive the state information of the battery cells 11a, the battery modules 11, and the battery racks 10 from the single management system, and monitor and control all battery cells 11a, battery modules 11, and battery racks 10.

The battery management apparatus 110 will be described later.

The battery management apparatus 110 may manage batteries provided in an eco-friendly vehicle 2. That is, the eco-friendly vehicle 2 may include the battery management apparatus 110.

Figure 3:
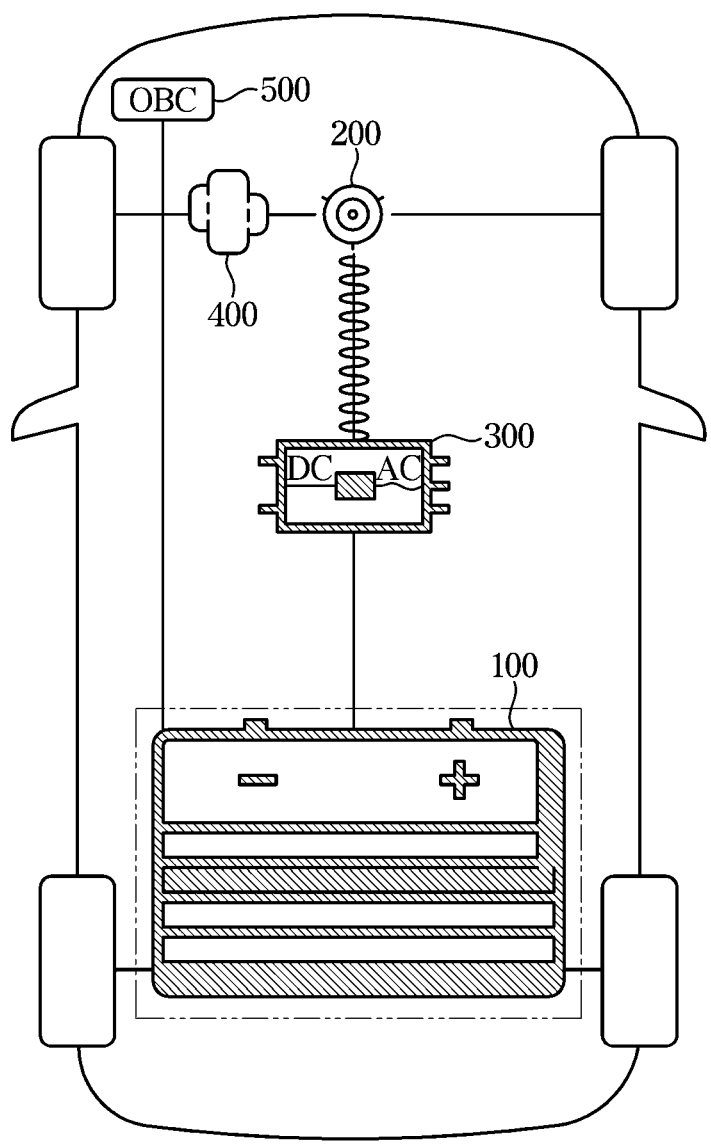
FIG. 3 is a view illustrating a vehicle according to an embodiment.

FIG. 3 is a view illustrating a vehicle according to an embodiment.

A vehicle 2 according to an embodiment is an eco-friendly vehicle, and may be a hybrid vehicle or an electric vehicle. In the embodiment, the electric vehicle will be described as an example.

As illustrated in FIG. 3, a power system of the vehicle 2 may include a battery 100, a motor 200, a motor driver 300, a decelerator 400, and a slow-speed charger 500.

The battery 100 may include the plurality of battery cells 11a that generates a high-voltage current to supply a driving force to the vehicle 2.

The vehicle 2 may further include a fan for lowering a temperature of the battery 100. The battery 100 may include the plurality of battery racks 10, and each battery rack 10 may include the plurality of battery modules 11 connected in series and in parallel. In addition, each battery module 11 may include the plurality of battery cells 11a connected in series and in parallel. Each battery rack may be connected in parallel.

That is, the most basic unit of the battery 100 may be the battery cells 11a, and each battery cell 11a may have a voltage range of 2.5 V to 4.2 V.

The plurality of battery cells 11a may be combined to form a battery module 11, and the plurality of battery modules 11 may be combined to form a battery rack 10. The plurality of battery racks 10 may connect in series and in parallel.

In addition, according to technical field, one battery cell is also referred to a battery, one battery module is also referred to a battery, and one battery rack is also referred to a battery. In this embodiment, the plurality of battery racks connected in series and in parallel are referred to batteries.

The vehicle 2 may further include a power converter.

The power converter may convert the power supplied from the outside into power for charging the battery 100 and supply the converted power to the battery 100. Here, the power supplied from the outside may be the power of a charging station or the electrical grid.

The motor 200 may generate a turning force (also called rotation power) using an electric energy from the battery 100, and transmit the generated turning force to the wheels to drive the wheels.

The motor 200 may convert the electric energy of the battery 100 into a dynamic energy for operating various electric devices provided in the vehicle 2.

The vehicle 2 may supply a maximum current to the motor 200 so that a maximum torque is generated when a booting button is turned on.

The motor 200 may operate as a generator in an energy regeneration mode due to braking, deceleration, or low-speed driving, enabling the battery 100 to be charged.

The motor driver 300 may drive the motor 200 in response to a control command from a controller. The motor driver 300 may include an inverter that converts the power of the battery 100 into driving power of the motor 200.

When outputting the driving power of the motor 200, the inverter may output the driving power of the motor 200 based on a target speed according to a user command. The driving power of the motor 200 may vary according to a switching signal for outputting a current corresponding to the target speed and the switching signal for outputting a voltage corresponding to the target speed. That is, the inverter may include a plurality of switching elements.

The inverter may also transmit power generated from the motor 200 to the battery 100 during regenerative braking. That is, the inverter may perform a function of changing a direction and output of the current between the motor 200 and the battery 100.

The decelerator 400 may decrease the speed of the motor 200 and transmit the turning force obtained by increasing the torque of the motor 200 to the wheels.

The vehicle 2 may further include the charger provided at the exterior parts of the body, connected to a charging cable and receiving power for charging the battery 100.

The charger may include a high-speed charger for quick charging the battery 100 and the slow-speed charger 500 for charging the battery to a slower rate than a rapid charging rate.

A cable for the quick charging may be connected to the high-speed charger, and a cable for slow charging may be connected to the slow-speed charger 500.

It is also possible to have the high-speed charger for quick charging and the slow-speed charger 500 for the slow charging at a slower charging rate than the quick charging at the same location or different locations on the exterior parts of the vehicle 2.

The slow-speed charger 500 may convert external commercial power (AC) into rectified and direct current and transmit it to the battery 100. For example, the slow-speed charger 500 may include an AC rectifier, a power factor correction (PFC), a converter, and a capacitor.

The high-speed charger may include at least one of a terminal or a cable for directly connecting an external high-speed charger and the battery 100.

Figure 4A:
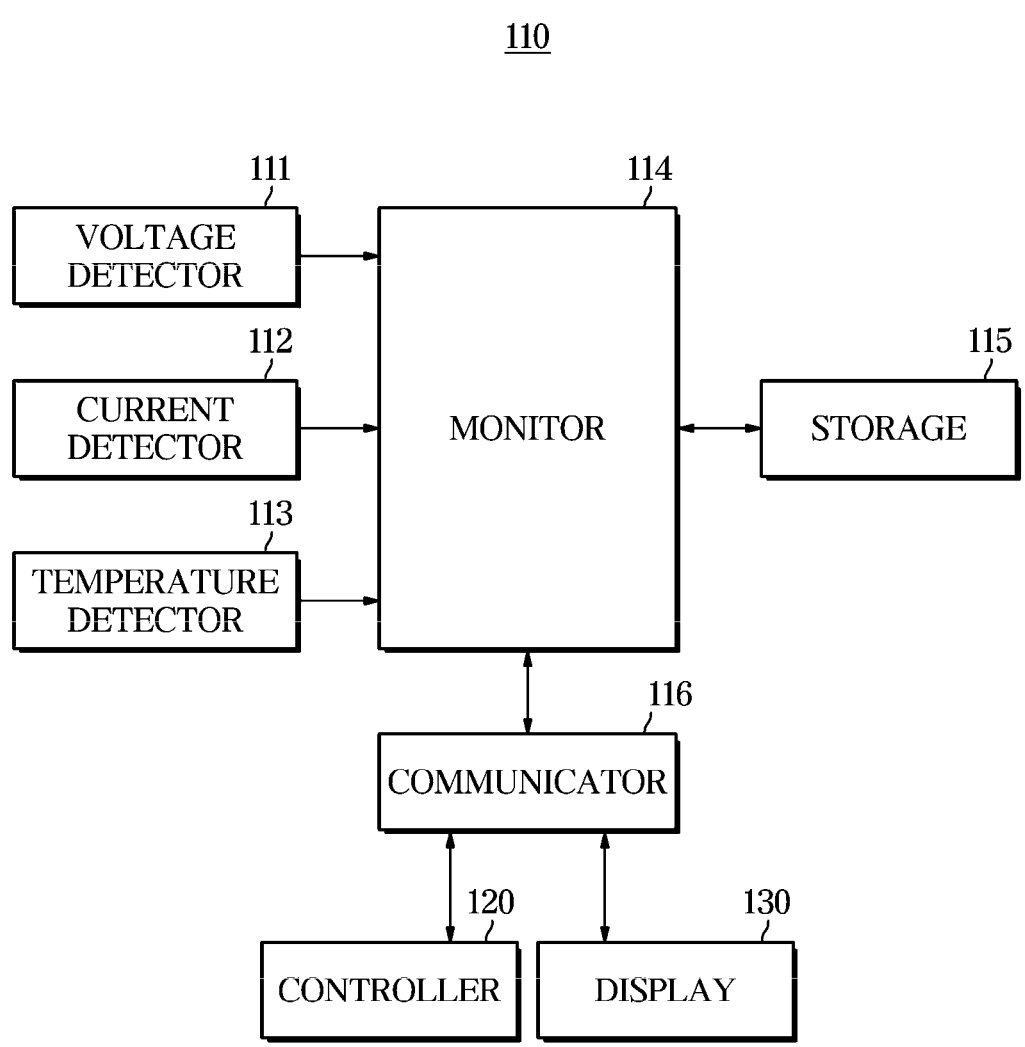
FIG. 4A is a detailed configuration diagram of a battery management apparatus of an energy storage system according to an embodiment.
Figure 4B:
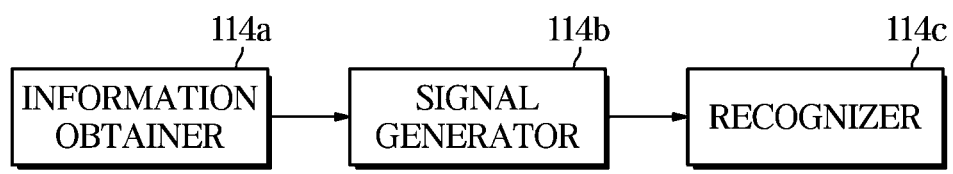
FIG. 4B is a detailed configuration diagram of a monitor of a battery management apparatus of an energy storage system according to an embodiment.

FIG. 4A is a detailed configuration diagram of a battery management apparatus of an energy storage system according to an embodiment, and FIG. 4B is a detailed configuration diagram of a monitor of a battery management apparatus of an energy storage system according to an embodiment. The battery management apparatus 110 may be the battery management apparatus provided in the energy storage system 1 or the battery management apparatus provided in the vehicle 2.

As illustrated in FIG. 4A, the battery management apparatus 110 may include a voltage detector 111, a current detector 112, a temperature detector 113, a monitor 114, a storage 115, and a communicator 116. The energy storage system 1 may further include a controller 120 and a display 130.

The battery management apparatus 110 monitors the state of the battery 100. The battery management apparatus 110 may monitor the state of each battery cell by using the battery cell as a unit, monitor the state of each battery module by using the battery module as a unit, and monitor the status of each battery rack by using the battery rack as a unit.

The battery management apparatus 110 may recognize a battery cell with a possibility of failure among the plurality of battery cells based on the monitoring result, and output information about the recognized battery cell.

The battery management apparatus 110 may recognize a battery module that has a possibility of failure among the plurality of battery modules based on the monitoring result, and may output information about the recognized battery module.

The battery management apparatus 110 may recognize a battery rack having a possibility of failure among the plurality of battery racks 10 based on the monitoring result and output information about the recognized battery rack.

A detailed configuration of the battery management apparatus 110 will be described later.

The battery 100 and the battery management apparatus 110 may be referred to as a battery management system (BMS).

The controller 120 may control the operation of the display 130 so that state information of the battery transmitted from the battery management apparatus 110 is output. The controller 120 may control an operation of a sound outputter so that the state information of the battery 100 transmitted from the battery management apparatus 110 is output.

The controller 120 may control operations of various electronic devices based on the state information of the battery 100 transmitted from the battery management apparatus 110.

For example, when the state information of the battery 100 transmitted from the battery management apparatus 110 is determined to be abnormal information of at least one battery cell, the controller 120 may control an output of the abnormal information of at least one battery cell and block the power supplied to various electronic device.

When it is determined that the state information of the battery 100 transmitted from the battery management apparatus 110 is the abnormal information of at least one battery cell, the controller 120 may selectively block power supplied to various electronic devices.

When a plurality of battery management apparatuses 110 are provided, the controller 120 may obtain the state information of the battery 100 by combining information transmitted from the plurality of battery management apparatuses 110 and control the output of the obtained state information of the battery 100.

The controller 120 may include a non-transitory memory storing an algorithm to control operation of the components in the energy storage system 1 or the vehicle 2 or data about a program that implements the algorithm, and a processor carrying out the aforementioned operation using the data stored in the memory. The memory and the processor may be implemented in separate chips. Alternatively, the memory and the processor may be implemented in a single chip.

The display 130 may display the abnormal information of the battery 100 in response to a control command of the controller 120. Here, the abnormal information of the battery 100 may include information about a possibility of a failure.

The display 130 may display battery management information, or display SOC information of a current battery.

The display 130 may display identification information of the battery cell in which an abnormality has occurred, identification information of the battery module or identification information of the battery rack, or also may display position information of the battery cell in which the abnormality has occurred, position information of the battery module or position information of the battery rack.

The display 130 may display guide information about thermal runaway of the battery 100 as an image.

The display 130 may also display the temperature and gas amount of the battery 100.

The energy storage system may further include the sound outputter.

The sound outputter may output guide information about thermal runaway of the battery 100 as a sound such as a warning sound. Here, the sound outputter may include a speaker.

Hereinafter, the battery management apparatus 110 will be described.

The battery management apparatus 110 is a detector that detects the SOC of the battery 100 to monitor the state of the battery 100, and may include the voltage detector 111, the current detector 112, and the temperature detector 113.

Here, the voltage detector 111 and the current detector 112 may be detectors that detect electrical signals for each of the cells of the battery 100.

The voltage detector 111 (e.g., a voltage sensor, etc.) may detect the voltage of the battery 100 and output a voltage signal about the detected voltage.

There may be a plurality of voltage detectors 111.

The plurality of voltage detectors 111 are connected to output terminals of the plurality of battery cells 11a to detect voltages of the plurality of battery cells 11a, respectively.

The plurality of voltage detectors 111 are connected to output terminals of the plurality of modules to detect voltages of the plurality of modules, respectively.

The plurality of voltage detectors 111 are connected to output terminals of the plurality of racks to detect voltages of the plurality of racks, respectively.

The battery management apparatus 110 may further include a switch connected to the voltage detector 111. The switch may be selectively connected to the plurality of battery cells. The voltage detector 111 may detect voltages of the plurality of battery cells, respectively, and output voltage information about voltages of each of the detected cells in response to a change in an on contact of the switch.

The current detector 112 (e.g., a current sensor, etc.) may detect a current of the battery 100 and output a current signal about the detected current.

There may be a plurality of current detectors 112.

The plurality of current detectors 112 may detect currents flowing through the plurality of battery cells 11a, respectively.

The plurality of current detectors 112 may detect currents flowing through the plurality of battery modules 11, respectively.

The plurality of current detectors 112 may detect currents flowing through the plurality of battery racks 10, respectively.

The temperature detector 113 may detect the temperature of the battery 100 and output a temperature signal for the detected temperature. The temperature detector 113 may be provided inside the battery rack.

There may be a plurality of temperature detectors 113.

The plurality of temperature detectors 113 may be provided on each of the plurality of battery cells 11a, and may detect temperatures of the plurality of battery cells 11a, respectively.

The plurality of temperature detectors 113 may be provided on each of the plurality of battery modules 11, and may detect temperatures of the plurality of battery modules 11, respectively.

The plurality of temperature detectors 113 may be provided in each of the plurality of battery racks 10, and may detect temperatures of the plurality of battery racks 10, respectively.

The monitor 114 may monitor the SOC of the battery 100 based on the detected current of the battery 100.

The monitor 114 may also monitor the SOC of the battery 100 based on the detected current and voltage of the battery 100.

The monitor 114 may monitor the SOC of the battery 100 based on the current, voltage, and temperature of each cell of the battery 100.

Here, the SOC of the battery 100 may include an amount of charge of the battery 100.

The monitor 114 may obtain the SOC of the battery 100 corresponding to the current, voltage, and temperature of the battery cells from a table stored in advance. In the table stored in advance, the amount of charge of the battery 100 corresponding to the correlation between the current, voltage, and temperature of the battery cells may be matched.

The monitor 114 may also obtain the SOH, an internal resistance R, and a capacity change dQ/dV for voltage change.

The monitor 114 may obtain the internal resistance R based on the voltage and current of the battery 100.

When a booting on command is received from the controller 120, the monitor 114 may identify the SOC of the battery 100 and output SOC information on the SOC of the identified battery 100 to the controller 120.

The monitor 114 may also output the obtained SOH, the internal resistance R, and the capacity change dQ/dV for the voltage change to the controller 120.

The monitor 114 may determine whether at least one battery cell is in the abnormal state based on at least one of the voltage, current, temperature of the battery 100, the SOC, SOH, internal resistance R of the battery 100, or capacity change dQ/dV for voltage change.

When determining whether the battery cell is in the abnormal state, the monitor 114 may generate the identification signal that manages the state of the battery 100 based on the received detection information, and determine whether the battery cell is in the abnormal state based on the generated identification signal. Here, the identification signal may be zero (0) or one (1).

The monitor 114 may determine whether at least one battery module is in the abnormal state, and may determine whether at least one battery rack is in the abnormal state.

The monitor 114 for determining whether at least one battery cell is in the abnormal state may include a processor and an associated non-transitory memory storing software instructions which, when executed by the processor, provides the functionalities of an information obtainer 114a, a signal generator 114b, and a recognizer 114c, The processor may take the form of one or more processor(s) and associated memory storing program instructions.

In addition, the information obtainer 114a, the signal generator 114b, and the recognizer 114c are provided separately from the monitor 114 and may transmit and receive information to and from the monitor 114. The configuration of the information obtainer 114a, the signal generator 114b, and the recognizer 114c will be described later with reference to FIG. 4B.

The monitor 114 may turn on a switching element when the battery 100 is in a normal state. When it is determined that the state of the battery 100 is a thermal runaway state, the monitor 114 may stop charging and discharging of the battery 100 by controlling the switching element to be turned off.

Here, the switching element may perform an ON operation when the battery 100 is in the normal state, and may perform an OFF operation when the battery 100 is in the thermal runaway state. The switching element may include a relay that supplies and cuts off the electric power charged in the battery 100 to the motor 200. The switching elements may protect the battery 100 and ensure electrical safety.

The monitor 114 may also determine thermal runaway based on the temperature information detected by the temperature detector 113.

The monitor 114 allows the battery 100 to cool by controlling a revolutions per minute (RPM) of the fan based on cell temperature information of the battery cell.

When it is determined that the state of the battery 100 is the thermal runaway state, the monitor 114 may control a driving of the fan to rotate at a maximum RPM. Through this, gas generated from the battery 100 may be discharged to the outside.

When it is determined that the state of the battery 100 is the thermal runaway state, the monitor 114 may directly transmit guide information about thermal runaway to the display 130 or may transmit it to the controller 120.

The controller 120 may include the non-transitory memory storing the algorithm to control operation of the components in the BMS or data about a program that implements the algorithm, and the processor carrying out the aforementioned operation using the data stored in the memory. The memory and the processor may be implemented in separate chips. Alternatively, the memory and the processor may be implemented in the single chip.

The storage 115 may store a table in which SOCs of batteries corresponding to the correlation between the current, voltage, and temperature of the battery 100 are matched.

The storage 115 may store a table in which the amount of charge of the battery 100 is matched corresponding to the correlation between the current, voltage, and temperature of the battery 100.

The storage 115 may store a deterioration rate corresponding to a period of use.

The storage 115 may be a non-transitory memory implemented with a chip separate from the aforementioned processor in relation to the monitor 114, or may be implemented integrally with the processor in the single chip.

The storage 115 may be implemented with at least one of the non-volatile memory device, such as cache, read only memory (ROM), programmable ROM (PROM), erasable programmable ROM (EPROM), electrically erasable programmable ROM (EEPROM), a volatile memory device, such as random access memory (RAM), or a storage medium, such as a hard disk drive (HDD) or a compact disk (CD) ROM, without being limited thereto.

The communicator 116 may communicate with the controller 120 and transmit state information of the battery 100 to the controller 120.

The communicator 116 may include at least one communication module configured to communicate with the controller 120. The communication module may be a hardware device implemented by various electronic circuits, e.g., processor, to transmit and receive signals via wireless or wired connections. For example, the communicator 116 may include at least one of a short-range communication module, a wired communication module, or a wireless communication module.

The short-range communication module may include a variety of short range communication modules, which is configured to transmit and receive a signal using a wireless communication module in the short range, e.g., Bluetooth module, Infrared communication module, Radio Frequency Identification (RFID) communication module, Wireless Local Access Network (WLAN) communication module, NFC communications module, and ZigBee communication module.

The wired communication module may include a variety of wired communication module, e.g., Controller Area Network (CAN) module, Local Area Network (LAN) module, Wide Area Network (WAN) module, or Value Added Network (VAN) module and a variety of cable communication module, e.g., Universal Serial Bus (USB), High Definition Multimedia Interface (HDMI), Digital Visual Interface (DVI), recommended standard 232 (RS-232), power line communication or plain old telephone service (POTS).

The wireless communication module may include a wireless communication module supporting a variety of wireless communication methods, e.g., Wi-Fi module, Wireless broadband module, global System for Mobile (GSM) Communication, Code Division Multiple Access (CDMA), Wideband Code Division Multiple Access (WCDMA), Time Division Multiple Access (TDMA), and Long Term Evolution (LTE).

At least one component may be added or deleted according to the performance of the components of the battery management apparatus illustrated in FIG. 4A. In addition, it will be readily understood by those of ordinary skill in the art that the mutual positions of the components may be changed corresponding to the performance or structure of the system.

Meanwhile, each component illustrated in FIG. 4A may refer to software and/or hardware components such as Field Programmable Gate Array (FPGA) and Application Specific Integrated Circuit (ASIC).

As illustrated in FIG. 4B, the monitor 114 may include the information obtainer 114a, the signal generator 114b, and the recognizer 114c.

The information obtainer 114a may receive detection signals detected by the voltage detector 111, the current detector 112 and the temperature detector 113, and may obtain the voltage information, current information, and temperature of the battery 110a from the detection signals received at a period of a predetermined time. Here, the detection signal may include the voltage signal, the current signal, and the temperature signal.

When obtaining the voltage information, the current information, and the temperature information of the battery 110a at the period of the predetermined time, the information obtainer 114a may obtain the voltage information, the current information, and the temperature information of each battery cell, obtain the voltage information, the current information, and the temperature information of each battery module, and obtain the voltage information, the current information, and the temperature information of each battery rack.

The information obtainer 114a may obtain total voltage information and total current information for the plurality of battery cells 11a.

The information obtainer 114a may obtain total voltage information and total current information for each of the plurality of battery modules 11, and may obtain total voltage information and total current information for each of the plurality of battery racks 10.

An example of the information obtainer 114a for obtaining the total voltage information for each of the plurality of battery cells 11a will be described with reference to FIGS. 5A and 5B.

Figure 5A:
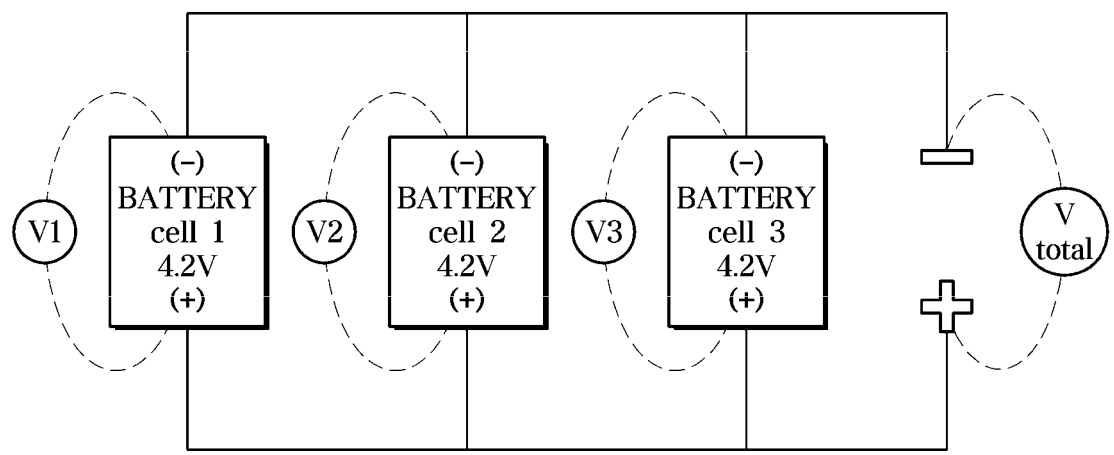
FIGS. 5A and 5B are view illustrating obtainment of total voltage information for each of a plurality of battery cells in a battery management apparatus of an energy storage system according to an embodiment.
Figure 5B:
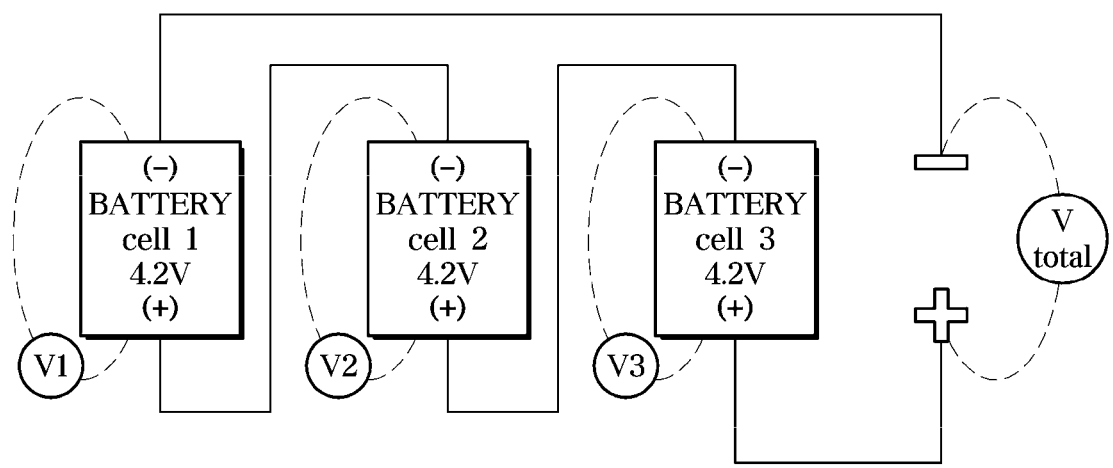

As illustrated in FIG. 5A, the plurality of battery cells 11a may be connected in parallel, and as illustrated in FIG. 5B, the plurality of battery 11a cells may be connected in series.

As illustrated in FIG. 5A, when the plurality of battery cells 11a are connected in parallel, the information obtainer 114a may obtain voltage information (V1, V2, V3) for each voltage of the plurality of battery cells 11a connected in parallel, and obtain voltage information Vtotal for the total voltages of the plurality of battery cells 11a connected in parallel.

In this case, the information obtainer 114a may obtain 4.2V as the voltage information about the voltage of each battery cell, and obtain 4.2V as the voltage information about the total voltage of the plurality of battery cells 11a connected in parallel. That is, when the plurality of battery cells 11a having the same voltage are connected in parallel, the voltage of individual battery cells 11a may be the same as the total voltage.

A total capacity Ah of the plurality of battery cells 11a connected in parallel with each other increases by the number of battery cells. That is, the information obtainer 114a may obtain the total capacity Ah of the plurality of battery cells 11a based on the number of the plurality of battery cells 11a connected in parallel.

As illustrated in FIG. 5B, when the plurality of battery cells 11a are connected in parallel, the information obtainer 114a may obtain voltage information (V1, V2, V3) for each voltage of the plurality of battery cells 11a connected in series, and obtain voltage information Vtotal for the total voltages of the plurality of battery cells 11a connected in series.

In this case, the information obtainer 114a may obtain 4.2V as the voltage information about the voltage of each battery cell, and obtain 12.6V as the voltage information about the total voltage of the plurality of battery cells 11a connected in series. That is, when the plurality of battery cells 11a having the same voltage are connected in series, a sum of the voltages of the plurality of battery cells 11a may be the same as the total voltage of the plurality of battery cells 11a connected in series.

When the plurality of battery cells 11a having the same voltage are connected in series, the total capacity Ah may be equal to one capacity of the battery cells. That is, the information obtainer 114a may obtain the total capacity Ah of the plurality of battery cells 11a corresponding to the capacity of one of the plurality of battery cells 11a connected in series.

An example of the information obtainer 114a for obtaining the total voltage information for each of the plurality of battery modules 11 will be described with reference to FIG. 6A.

The battery module may include the plurality of battery sets connected in series. Here, each battery set may include the plurality of battery cells 11a connected in parallel.

The information obtainer 114a may obtain voltage information about the voltage of each battery set.

Since each battery set has the plurality of battery cells 11a connected in parallel, the total voltage in each battery set may be the same as the voltage of the cell of one battery.

The information obtainer 114a may obtain voltage information about the total voltage of the battery module based on voltage information (V1, V2, . . . , Vn) of the plurality of battery sets.

That is, since the plurality of battery sets are connected in series, the information obtainer 114a may obtain voltage information Vm-total about the voltage of the battery module by summing all the voltages of the plurality of battery sets.

An example of the information obtainer 114a for obtaining the total voltage information for each of the plurality of battery racks 10 will be described with reference to FIG. 6A.

Figure 6A:
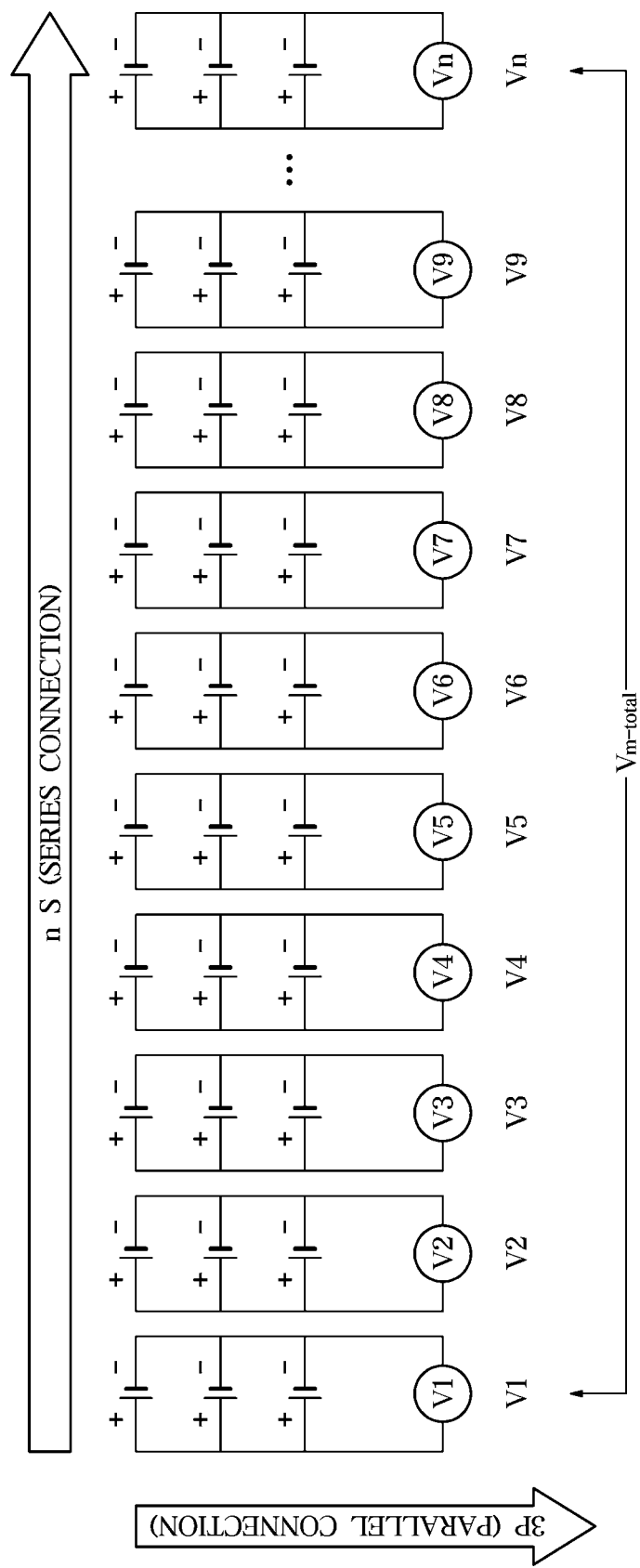
FIG. 6A is a view illustrating obtainment of total voltage information for each of a plurality of battery modules in a battery management apparatus of an energy storage system according to an embodiment.
Figure 6B:
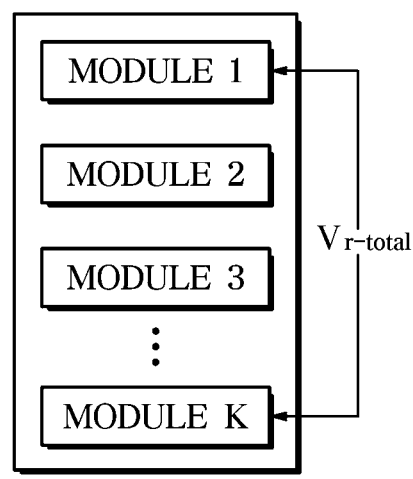
FIG. 6B is a view illustrating obtainment of total voltage information for each of a plurality of battery racks in a battery management apparatus of an energy storage system according to an embodiment.

The battery rack may include the plurality of battery modules 11 illustrated in FIG. 6A.

The plurality of battery modules 11 may be connected in series or in parallel.

When the plurality of battery modules 11 are connected in parallel, the information obtainer 114a may obtain the voltage of one battery module as the voltage information about the total voltage of the plurality of battery modules 11.

When the plurality of battery modules 11 are connected in series, the information obtainer 114a may sum all the voltages of the plurality of battery modules 11 and obtain the summed total voltage as voltage information Vr-total for the total voltages of the plurality of battery modules 11.

The information obtainer 114a may obtain voltage information of individual battery cells and total voltage information of the battery 100 as information with high correlation.

The information obtainer 114a may obtain current information of individual battery cells and total current information of the battery 100 as information with high correlation.

The information obtainer 114a may obtain the SOC of the battery 100 based on the detected current of the battery 100.

The information obtainer 114a may also obtain the SOC of the battery 100 based on the detected current and voltage of the battery 100.

The information obtainer 114a may obtain the SOC of the battery 100 based on the current, voltage, and temperature of each cell of the battery 100.

Here, the SOC of the battery 100 may include the amount of charge of the battery 100.

The information obtainer 114a may obtain the SOC of the battery 100 corresponding to the current, voltage, and temperature of the battery cells from a table stored in advance. In the table stored in advance, the amount of charge of the battery 100 corresponding to the correlation between the current, voltage, and temperature of the battery cells may be matched.

The information obtainer 114a may also obtain the SOH, the internal resistance R, and the capacity change dQ/dV for the voltage change.

The information obtainer 114a may obtain the deterioration rate of the battery based on the temperature of the battery 100 and a charging rate of the battery 100, and obtain the SOH of the battery 100 based on the obtained deterioration rate of the battery 100.

The charging rate of the battery 100 may be a ratio of a chargeable amount of a total amount of charging in the battery 100.

The information obtainer 114a may also obtain a battery deterioration rate corresponding to the use period of the battery 100 from the information stored in the storage 115.

The information obtainer 114a may also obtain the deterioration rate of the battery 100 based on the reduced capacity compared to a rated capacity of the battery 100.

The signal generator 114b may analyze at least one of the voltage, the current, the temperature of the battery 100, the SOC, the SOH, the internal resistance R of the battery 100, or the capacity change dQ/dV for voltage change, and may generate the identification signal corresponding to the abnormal state of the battery based on the analysis result and output the generated identification signal.

Here, the abnormal state of the battery may be one of the abnormal state of at least one battery cell, the abnormal state of at least one battery module, and the abnormal state of at least one battery rack.

The signal generator 114b may analyze the correlation of the information obtained from the information obtainer 114a, obtain the correlation as a continuous signal from a first value (1) to a second value (−1) based on the analyzed correlation, and determine whether the continuous signals are similar. When the continuous signals are similar, the signal generator 114b may generate a first identification signal. When the continuous signals are not similar, the signal generator 114b may generate a second identification signal.

The first identification signal may be zero (0) or one (1), and the second identification signal may be a signal different from the first identification signal.

An example of generating the identification signal corresponding to the abnormal state of the battery cell will be described with reference to FIGS. 7 and 8A and 8B.

The signal generator 114b may obtain the value of the correlation coefficient corresponding to the correlation of the electrical signal for each of the plurality of battery cells 11a, and generate identification signals corresponding to the electrical signals of the plurality of battery cells 11a based on the values of the correlation coefficients and reference values.

More particularly, when the total voltage of the battery 100 and the voltage of each battery cell are received, the signal generator 114b may accumulate and store the received information based on the received time, calculate an average value of the total voltage accumulated and stored for the predetermined time and the average value of each battery cell voltage, obtain a covariance using the average of the calculated total voltage and the average value of each battery cell voltage, and obtain a product of a standard deviation.

Here, the covariance may be a molecule in Equation 1. And the standard deviation may be a denominator in Equation 1.

$$r_{x,y} = \frac{COV_{x,y}}{\sigma_x \sigma_y} = \frac{\sum_{1}^{n}(x_i - \mu_x)(y - \mu_y)}{\sqrt{\sum_{i=1}^{n}(x_i - \mu_x)^2} \sqrt{\sum_{i=1}^{n}(y - \mu_y)^2}} \quad \text{Equation 1}$$

$r_{x,y}$: correlation coefficient between x and y

Total voltage information, y—>$V_{total}$,

Voltage information of an i-th battery cell, y—>$V_{cell1}$, $V_{cell2}$, . . . $V_{celli}$, Voltage information received for a predetermined time n, $V_n = V_1, V_2 . . . V_n$ σ: standard deviation over the predetermined time n, μ: average over the predetermined time n Equation 1 is an equation that calculates the value of the correlation coefficient that expresses a degree of correlation between two variables as an index. That is, Equation 1 may be an equation for calculating the value of the correlation coefficient of the battery cell voltage with respect to the total voltage.

In the relationship between the covariance and two variables X and Y, if the covariance is greater than 0, Y also increases as X increases, if the covariance is less than 0, Y decreases as X increases, and if the covariance is 0, it means that there is no correlation between the two variables.

When the covariance is divided by each variance of X and Y, the correlation coefficient is calculated, thereby outputting positive and negative correlations and a magnitude of the correlations. The magnitude of the correlation has a value of 1 to −1 including 0. Thai is, the signal generator 114b may calculate the value of the correlation coefficient as the continuous signal based on Equation 1, but may be calculated as the continuous signal ranging from the first value (1) to the second value (−1).

Figure 7:
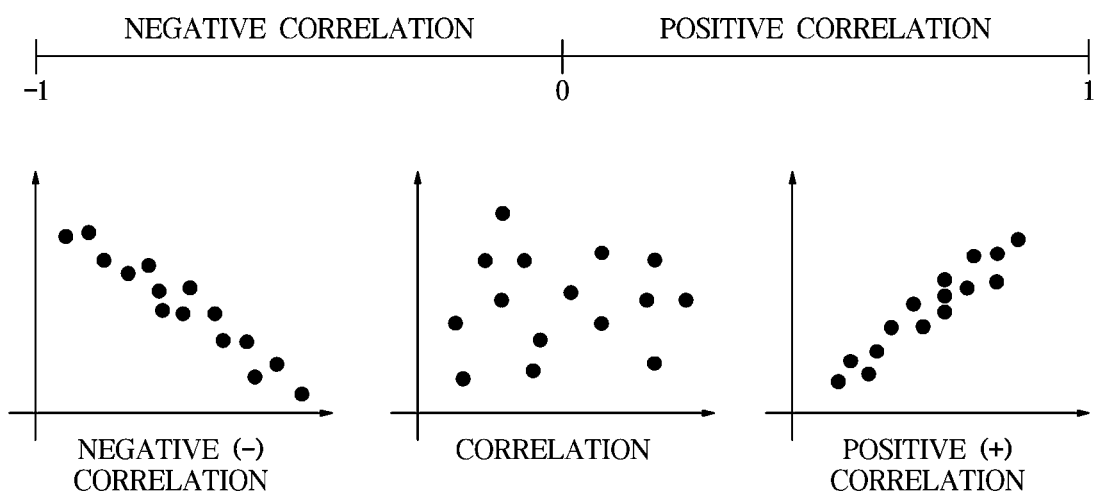
FIG. 7 is a correlation graph of a variable corresponding to a value of a correlation coefficient calculated by a battery management apparatus of an energy storage system according to an embodiment.

As illustrated in FIG. 7, when the value of the correlation coefficient has a positive value, when one variable increases, the other variable increases, and when one variable decreases, the other variable decreases.

When the value of the correlation coefficient has a negative value, when one variable increases, the other variable decreases in reverse, and when one variable decreases, the other variable increases in reverse.

When the value of the correlation coefficient is 0, the two variables are completely independent.

The signal generator 114b may determine whether a trend of voltage change between one battery cell and the other battery cells is similar or different by calculating the value of the correlation coefficient of the voltage of each battery cell with respect to the total voltage.

That is, when the voltage signal of each battery cell is input, the signal generator 114b determines whether the voltage signals between the battery cells disposed adjacent to each other have a similar tendency to each other, and when it is determined that the voltage signals have the similar tendency, a value close to 1 is output and when it is determined that the voltage signals have different tendency, an identification number of the battery cell is output.

The signal generator 114b may generate the identification signal corresponding to the state of the battery 100 using signals having the same correlation with each other. Here, the same correlation may be a relationship in which the correlation coefficient is a reference value (e.g. 0.5).

For example, the signals having the same correlation with each other may be the signal for the total voltage and the signal for the voltage of each battery cell.

Figure 8A:
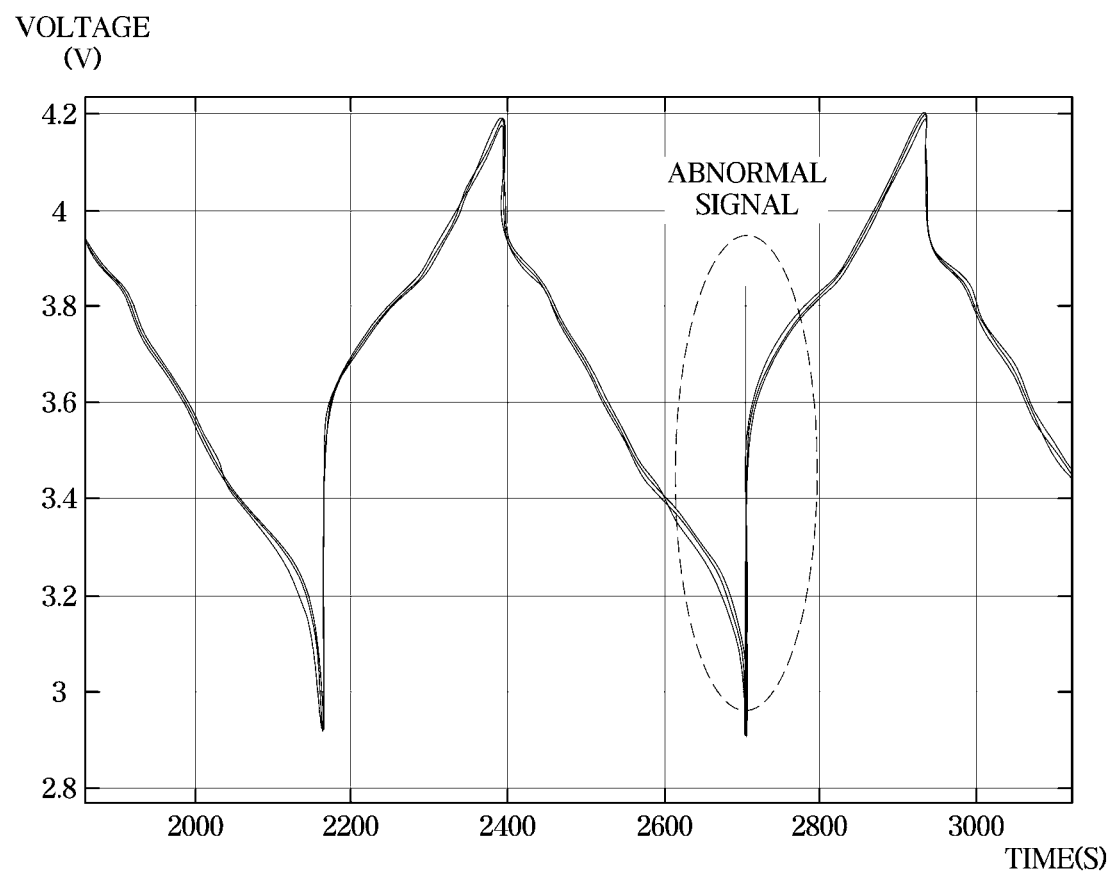
FIG. 8A is a graph illustrating voltage changes of a plurality of battery cells provided in an energy storage system according to an embodiment.
Figure 8B:
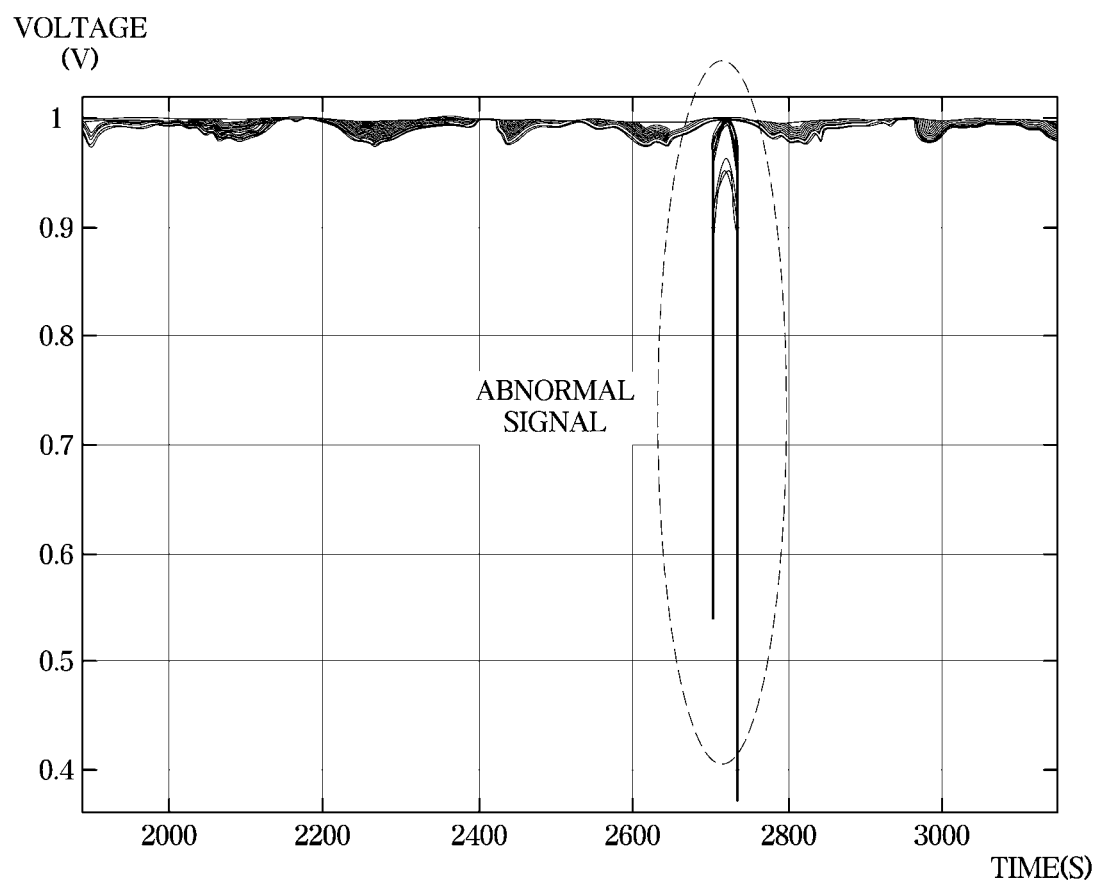
FIG. 8B is a graph illustrating correlation coefficients of the plurality of battery cells.

FIG. 8A is a graph illustrating voltage changes of a plurality of battery cells 11a, and FIG. 8B is a graph illustrating correlation coefficients of the plurality of battery cells 11a.

The signal generator 114b may obtain the values of the calculated correlation coefficients of the plurality of battery cells 11a, respectively, generate and output the first identification signal for the correlation coefficient equal to or greater than a reference value among the values of the identified correlation coefficients, and generate and output the second identification signal for the correlation coefficient less than the reference value.

As illustrated in FIG. 8B, when the voltage of one battery cell tends to be different from the voltage of the other battery cell, the value of the correlation coefficient less than the reference value (approximately 0.5) may be calculated. At this time, the identification number of the battery cell may be output.

The signal generator 114b may recognize the abnormal state of at least one battery cell using various abnormality detection algorithms such as a classification algorithm and a clustering algorithm.

Figure 8C:
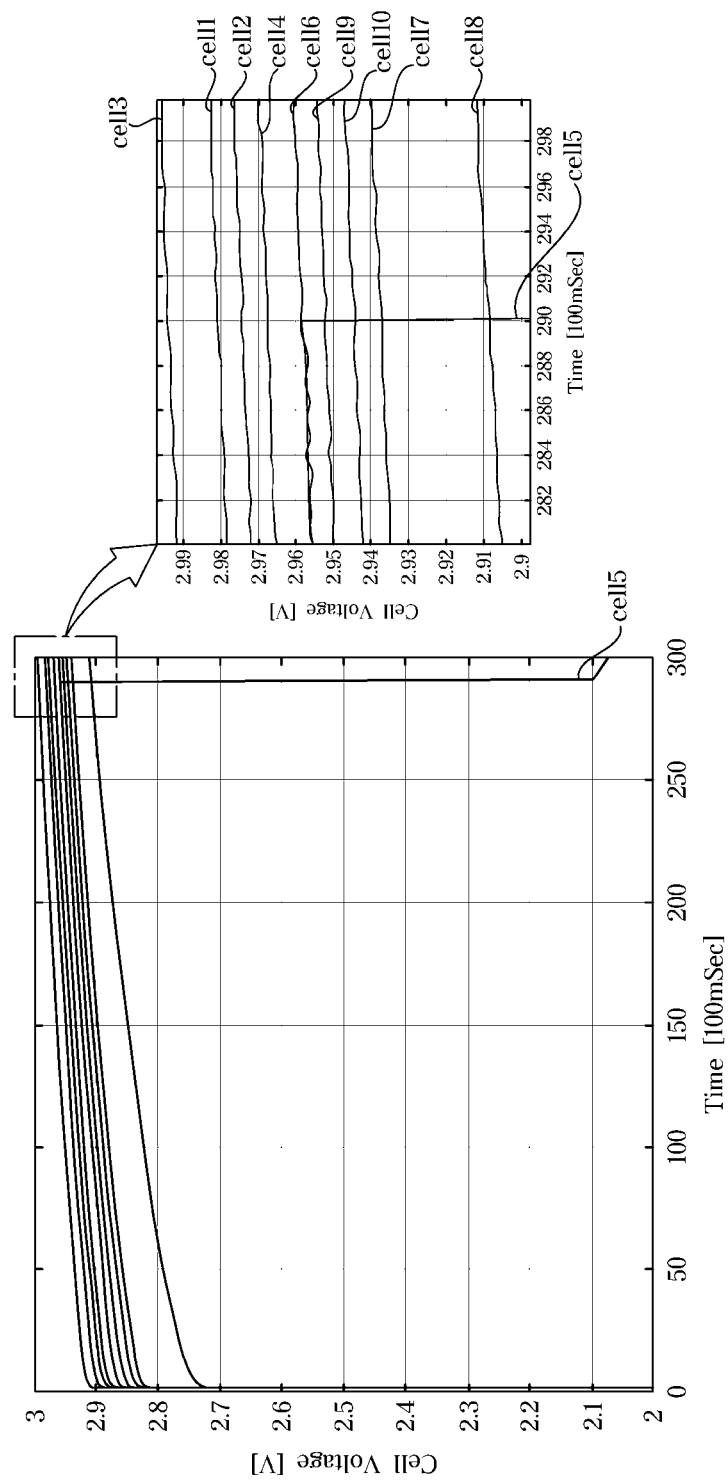
FIG. 8C is a graph illustrating voltage changes of a plurality of battery cells provided in an energy storage system according to an embodiment.
Figure 8D:
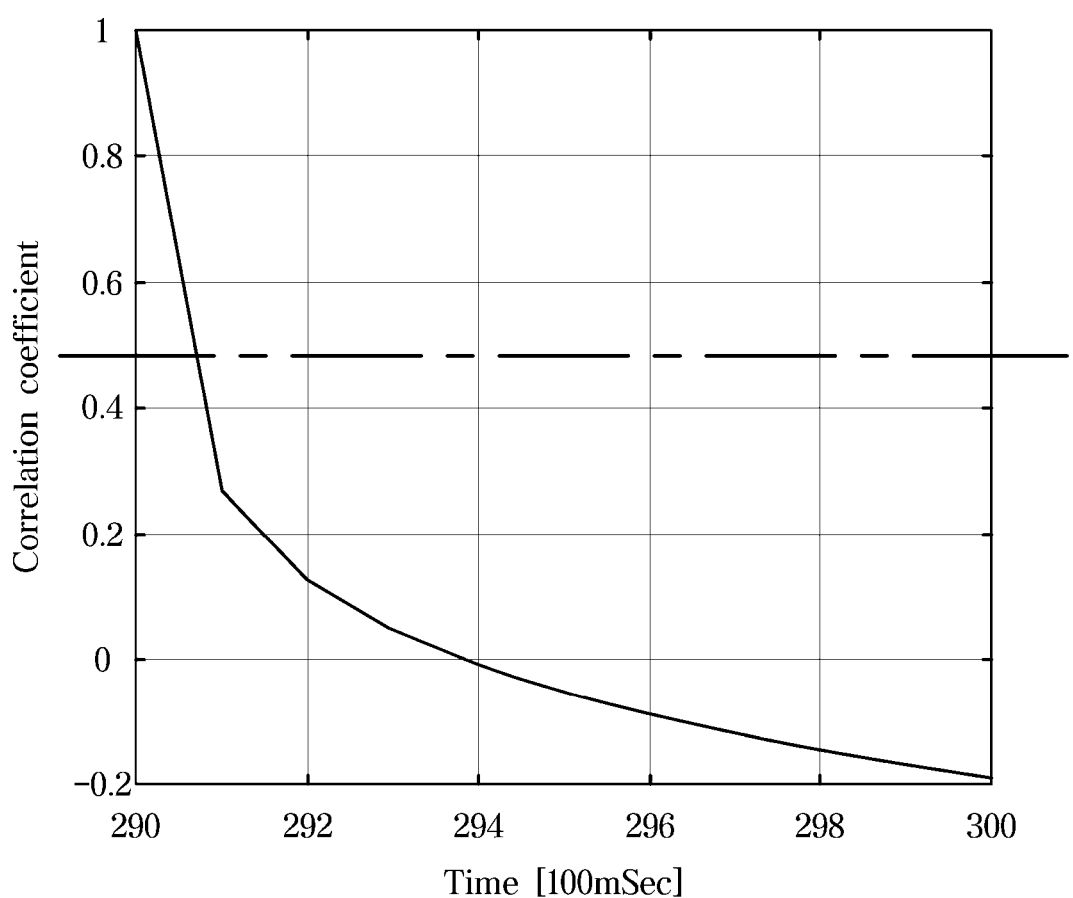
FIG. 8D is a graph illustrating correlation coefficients of the plurality of battery cells.

FIG. 8C is a graph illustrating voltage changes of a plurality of battery cells 11a, FIG. 8D is a graph illustrating correlation coefficients of the plurality of battery cells 11a, and FIGS. 8C and 8D are graphs of an example of an experiment different from those of FIGS. 8A and 8B.

Even in this case, when the signal generator 114b determines that the values of the voltage of the plurality of battery cells 11a have the same or similar tendency to each other, the correlation coefficient is calculated as a value close to 1, and when the signal generator 114b determines that the voltage of at least one of the plurality of battery sells has a different tendency from the other values of voltage, the correlation coefficient is calculated as a value close to 0. In addition, the signal generator 114b may obtain the values of the calculated correlation coefficients of the plurality of battery cells 11a, respectively, generate and output the first identification signal (e.g. 1) for the correlation coefficient equal to or greater than a reference value (approximately 0.5) among the values of the identified correlation coefficients, and generate and output the second identification signal (e.g. 0) for the correlation coefficient less than the reference value.

As illustrated in FIG. 8D, in the case of battery cells having different tendencies among values of the voltage of the plurality of battery cells 11a, the value of the correlation coefficient less than the reference value (approximately 0.5) may be calculated. In this case, the signal generator 114b may output the second identification signal to the battery cells tends to be different from the voltage, but may also output the identification number of the battery cell.

The signal generator 114b obtains a standardized score (Z-score) based on information obtained by the information obtainer 114a and generates the first identification signal or the second identification signal based on the obtained Z-score. The first identification signal may be zero (0) or one (1), and the second identification signal may be a signal different from the first identification signal.

The Z-score may include a value between a first score and a second score. For example, the first score may be −3 points, and the second score may be 3 points.

More specifically, when the voltage information of individual battery cells V1, V2, and V3 is received, the signal generator 114b calculates an average value ($\mu$=Vaverage) of each battery cell voltage based on the received voltage information for each battery cell, and obtains the standard deviation $\sigma$ using the average value of each battery cell voltage.

The signal generator 114b obtains the Z-score based on the standard deviation, the voltage, and the average value of each battery cell.

$$\mu = V_{average} = \frac{\sum_{i=1}^{n} x_i}{n}$$

$$\sigma_x = \sqrt{\sum_{i=1}^{n}(x_i - \mu_x)^2}$$

$$Z-\text{score} = \frac{(x_i - \mu_x)}{\sigma_x}$$

Vn is the voltage information of n battery cells, xi is the voltage of the i-th battery cell among the n battery cells, $\mu$ is the average voltage for the n battery cells, $\sigma$ is the standard deviation of the voltage for the n battery cells, and Z-score is a standardized score for n battery cells.

The Z-score is a value indicating a degree of dispersion of values of the voltages of the plurality of battery cells 11a based on the average value of the voltages of the plurality of battery cells 11a, and may be obtained as 0 or more values by scoring deviations from the average value of the voltages.

In other words, the Z-score is a value indicating distribution of voltage data of battery cells by calculating a ratio of the standard deviation to a deviation value, which is the difference between the value of the voltage of each battery cell and the average value of the voltage.

The Z-score closer to 0 means that the value of the voltage of the battery cells is closer to the average value, and the Z-score farther from 0 means that the value of the voltage of the battery cells is farther from the average value.

The Z-score is relative information and may be expressed as a value of a probability variable for the difference from the average value of the voltage regardless of large or small the value of the voltage of the battery cells.

Figure 8E:
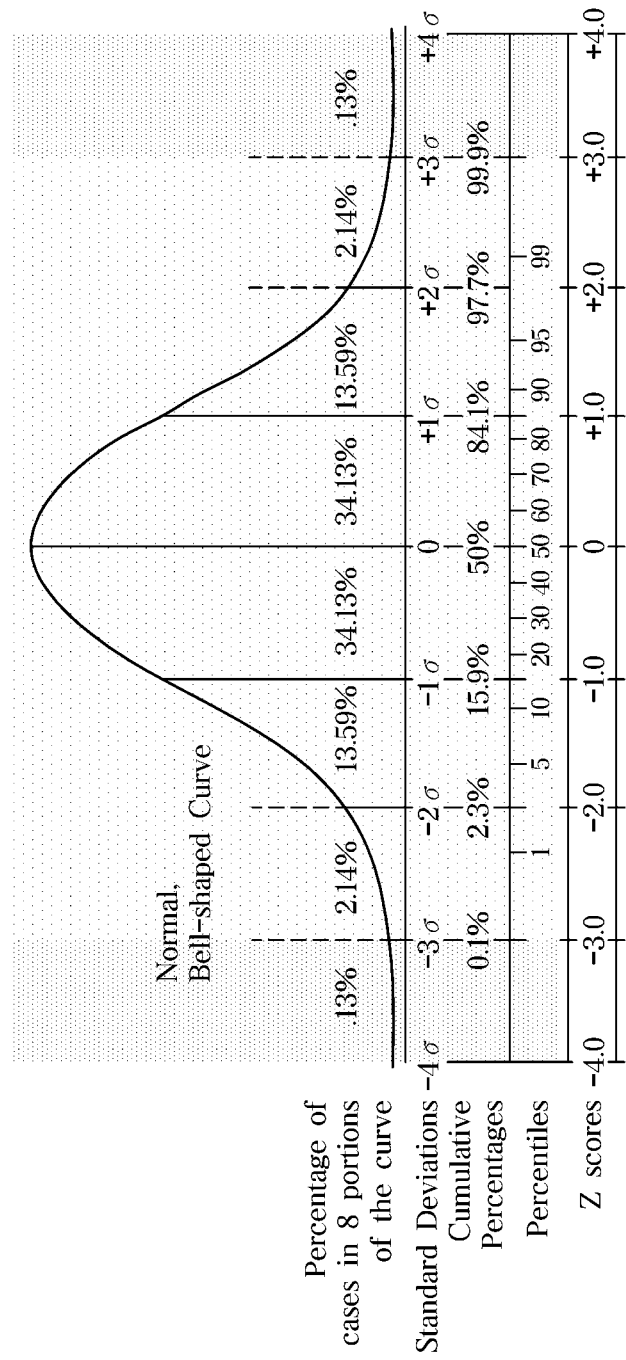
FIG. 8E is a graph of a standard deviation and a Z-score.

As illustrated in FIG. 8E, when the values of the voltage of the battery cells are statistically normally distributed, 99.7% of total voltage data indicates that the Z-score is 3 or less, which means that the value of the voltage (i.e., voltage data) of most battery cells exist within 3 times the standard deviation probabilistically.

Figure 8F:
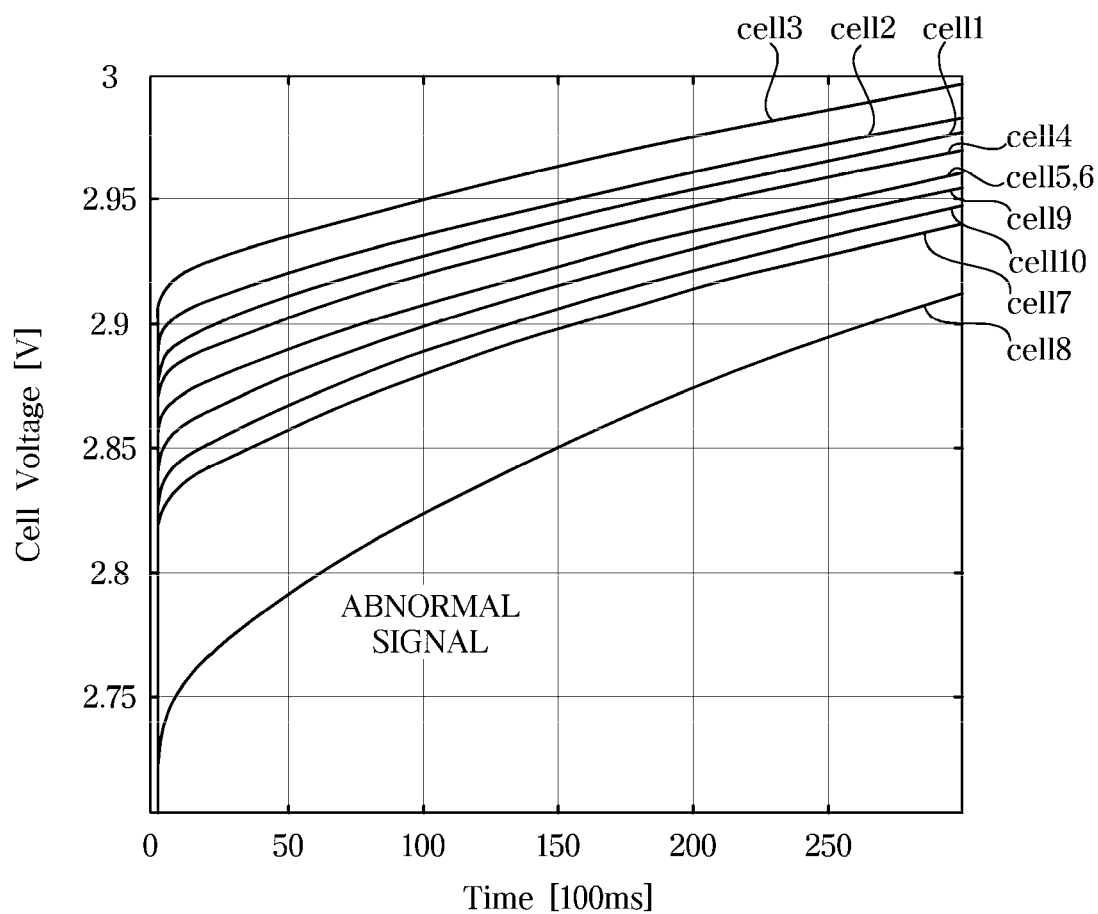
FIG. 8F is a graph illustrating voltage changes of a plurality of battery cells provided in an energy storage system according to an embodiment.
Figure 8G:
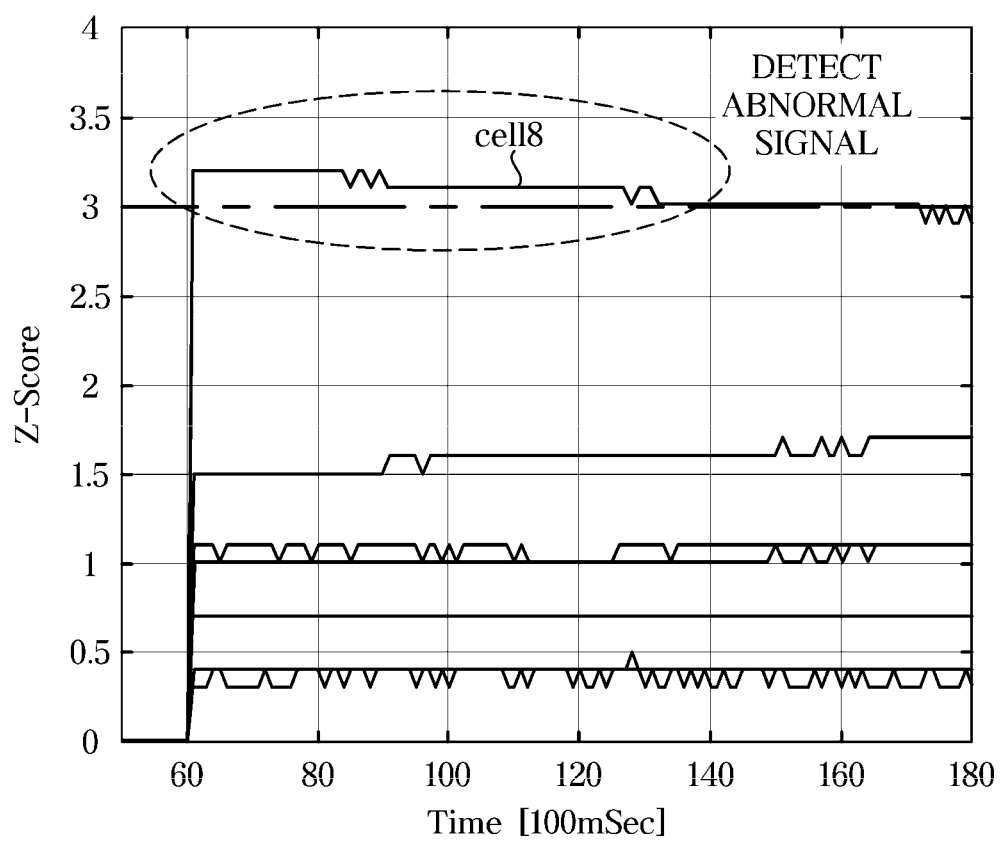
FIG. 8G is a graph illustrating a Z-score of the plurality of battery cells

FIG. 8F is a graph illustrating voltage changes of a plurality of battery cells 11a, and FIG. 8G is a graph illustrating the Z-scores of the plurality of battery cells 11a.

As illustrated in FIG. 8G, in the case of the values of the voltages between the plurality of battery cells 11a have the same tendency and when the deviation of the value of the voltage from other battery cells is as low as about 0.1 V or less, the Z-score may be calculated as less than 3, but when the deviation of the value of the voltage from other battery cells increases, the Z-score may be calculated as 3 or more. Here, the Z-score 3 may be a reference Z-score.

The signal generator 114b generates and outputs the first identification signal (e.g., 1) for a battery cell having the Z-score of 3 or less, and generated and outputs the second identification signal (e.g., 0) for a battery cell having the Z-score exceeding 3.

The signal generator 114b may generate and output the first and second identification signals for battery cells based on the correlation coefficient, or the Z-score, or the correlation coefficient and the Z-score.

As such, the signal generator 114b may diagnose a failure between adjacent battery cells 11a, between adjacent battery modules 11, or between adjacent battery racks 10, based on at least one of the correlation coefficient and the Z-score, and correspondingly, it is possible to monitor the identification number of the battery cells 11a, the battery modules 11 or the battery racks 10 for fire prevention.

The recognizer 114c may receive the first and second identification signals output from the signal generator 114b.

When receiving the second identification signal, the recognizer 114c may receive the identification information (i.e., the identification number) of the battery cell corresponding to the second identification signal together, and may also receive time information about a generation time of the second identification signal or a reception time of the voltage signal corresponding to the second identification signal.

The recognizer 114c may accumulate and store the second identification signal received from the signal generator 114b. When the recognizer 114c accumulates and stores the second identification signal, the recognizer 114c may store the identification information and the time information of the battery cell in the storage 115.

The recognizer 114c may recognize the abnormal state of the battery cell based on the accumulated and stored second identification signal, and recognize a risk of failure based on the recognition result.

The recognizer 114c may count the number of generations of the second identification signal for each battery cell based on the accumulated and stored second identification signal, and recognize the risk of failure based on the number of generations of the counted second identification signal.

The recognizer 114c may transmit an alarm and a block command signal to the controller 120 in response to recognition of the abnormal state of the battery cell.

Figure 9A:
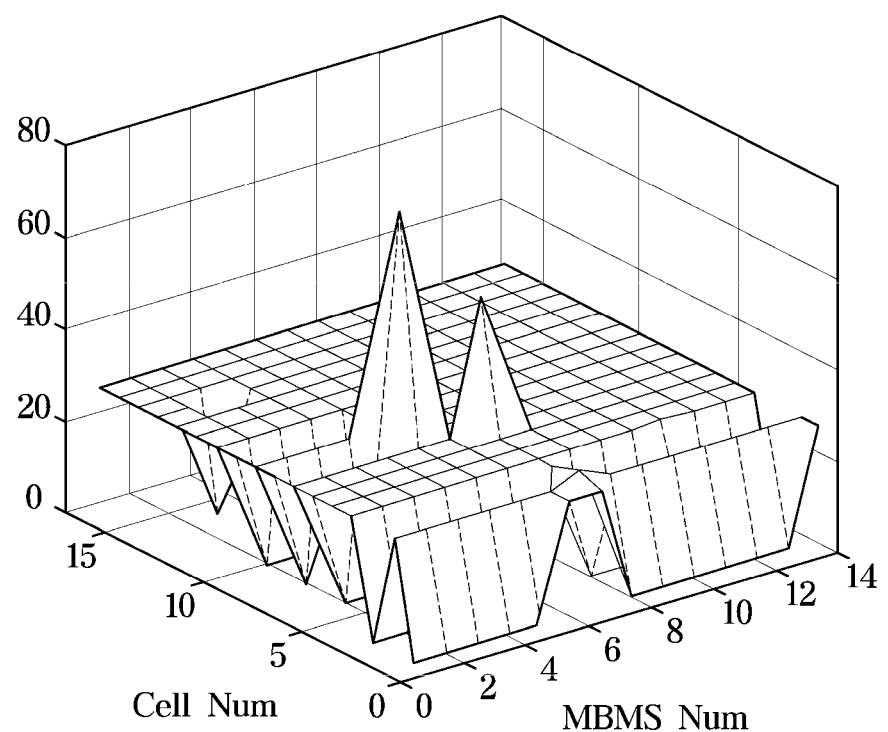
FIGS. 9A and 9B are views illustrating information related to an identification signal accumulated and stored in a battery management apparatus of an energy storage system according to an embodiment.
Figure 9B:
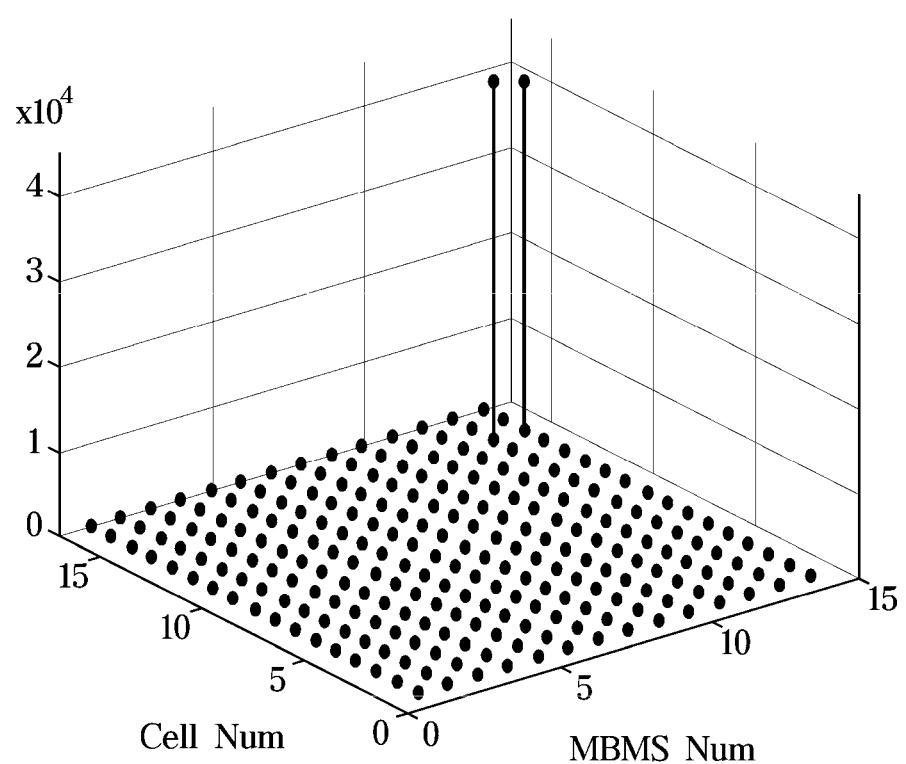

As illustrated in FIGS. 9A and 9B, the recognizer 114c may accumulate and manage the number of generations of the second identification signal for each battery cell as position information in a form of a matrix including identification information (rack number/module number/cell number) of the battery cells.

In addition, accumulated information of the second identification signal may be information normalized based on a probabilistic method such as an accumulation frequency over time and a frequency according to the number of generations.

The recognizer 114c may diagnose and prevent battery cell failure by recognizing the risk of failure based on the repeatability and frequency of the occurrence of the abnormal signal, rather than recognizing the abnormal state of the battery cell with one recognition of the second identification signal.

At least one component may be added or deleted according to the performance of the components of the monitor 114 illustrated in FIG. 4B. In addition, it will be readily understood by those of ordinary skill in the art that the mutual positions of the components may be changed corresponding to the performance or structure of the system.

Meanwhile, each component illustrated in FIG. 4B may refer to software and/or hardware components such as Field Programmable Gate Array (FPGA) and Application Specific Integrated Circuit (ASIC).

Figure 10:
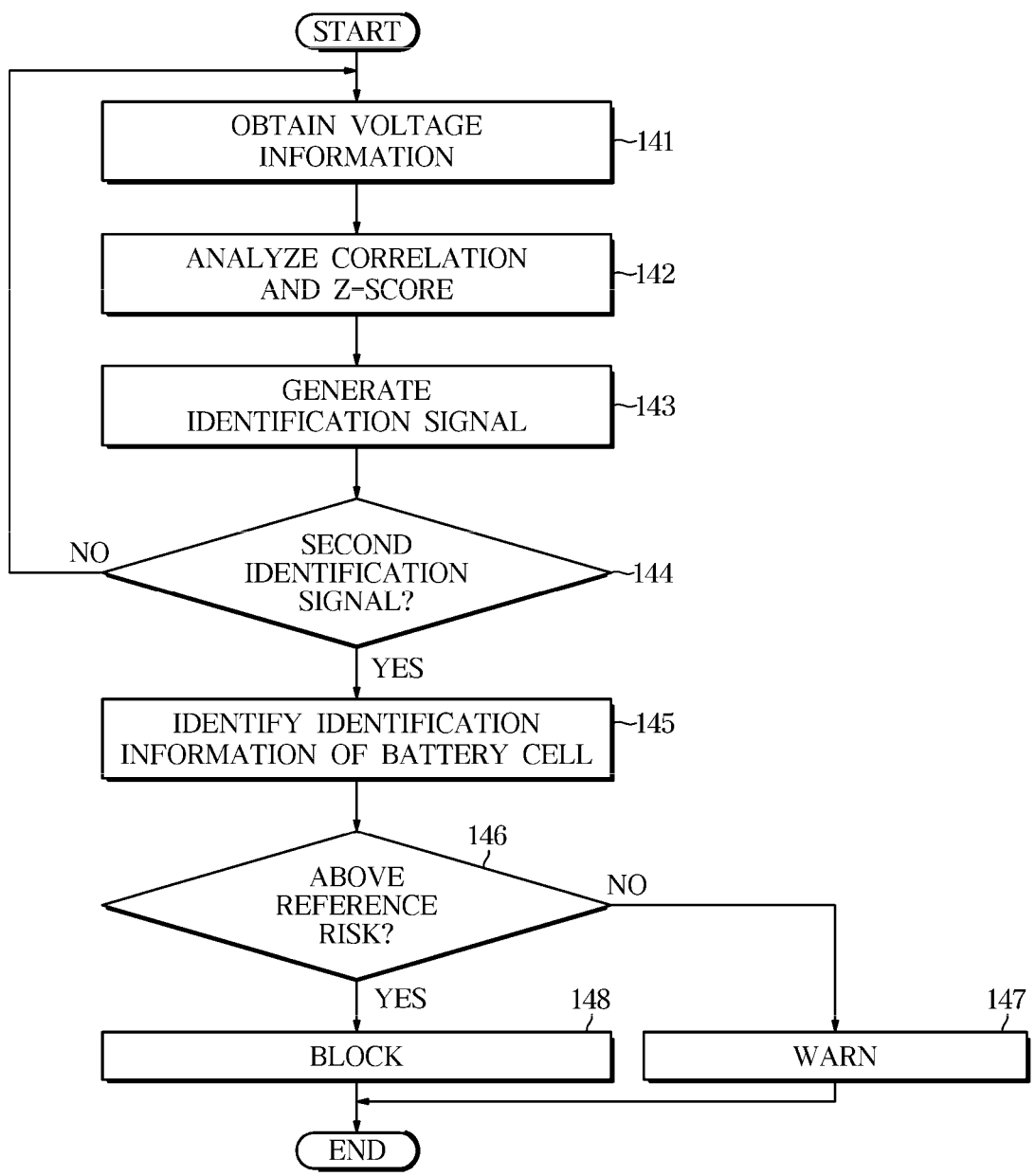
FIG. 10 is a control flowchart of an energy storage system according to an embodiment.

FIG. 10 is a control flowchart of an energy storage system according to an embodiment.

The energy storage system 1 may obtain the voltage information corresponding to the voltage of the battery cells detected by the voltage detector 111, and may obtain voltage information corresponding to the total voltage of all battery cells based on the voltages of the plurality of battery cells 11a and a connection relationship between the plurality of battery cells 11a, that is, parallel connection and series connection (141).

The energy storage system 1 may analyze the correlation of the battery cells based on the voltage of the battery cells and the total voltage, obtain the correlation coefficient as the continuous signal from the first value (1) to the second value (−1) based on the analyzed correlation, and analyze the Z-score of the battery cells based on the value of the voltage, the average value, and the standard deviation of each battery cell (142).

Here, the obtaining the value of the correlation coefficient may include calculating the value of the correlation coefficient using information about the total voltage obtained over the predetermined time and voltages of battery cells.

More particularly, when the total voltage of the battery 100 and the voltage of each battery cell are received, the energy storage system 1 may accumulate and store the received information based on the received time, calculate the average value of the total voltage accumulated and stored for the predetermined time and the average value of each battery cell voltage, obtain the covariance using the average of the calculated total voltage and the average value of each battery cell voltage, and obtain the product of a standard deviation.

Here, the covariance may be the molecule in Equation 1. And the standard deviation may be a denominator in Equation 1.

$$r_{x,y} = \frac{COV_{x,y}}{\sigma_x \sigma_y} = \frac{\sum_1^n (x_i - \mu_x)(y - \mu_y)}{\sqrt{\sum_{i=1}^n (x_i - \mu_x)^2} \sqrt{\sum_{i=1}^n (y - \mu_y)^2}} \quad \text{Equation 1}$$

$r_{x,y}$: correlation coefficient between x and y

Total voltage information, y—>$V_{total}$

Voltage information of an i-th battery cell, y—>$V_{cell1}$, $V_{cell2}$, ... $V_{celli}$, Voltage information received for a predetermined time n, $V_n = V_1, V_2 ... V_n$ σ: standard deviation over the predetermined time n, μ: average over the predetermined time n Equation 1 is the equation that calculates the value of the correlation coefficient that expresses the degree of correlation between two variables as the index.

The energy storage system, when the voltage information of individual battery cells V1, V2, and V3 is received, calculates the average value (μ=Vaverage) of each battery cell voltage based on the received voltage information for each battery cell, and obtains the standard deviation a using the average value of each battery cell voltage.

The energy storage system obtains the Z-score based on the standard deviation, the voltage, and the average value of each battery cell.

$$\mu - V_{average} = \frac{\sum_{i=1}^n x_i}{n}$$

$$\sigma_x = \sqrt{\sum_{i=1}^n (x_i - \mu_x)^2}$$

$$Z - \text{score} = \frac{(x_i - \mu_x)}{\sigma_x}$$

In the case of the values of the voltages between the plurality of battery cells 11a have the same tendency and when the deviation of the value of the voltage from other battery cells is as low as about 0.1 V or less, the energy storage system may be calculated the Z-score as less than 3, but when the deviation of the value of the voltage from other battery cells increases, the energy storage system may be calculated the Z-score as 3 or more.

The energy storage system 1 generates and outputs the first identification signal (e.g., 1) for a battery cell having the Z-score of 3 or less, and generated and outputs the second identification signal (e.g., 0) for a battery cell having the Z-score exceeding 3. The energy storage system 1 may obtain the value of the correlation coefficient for each of the plurality of battery cells 11a, generate the identification signal based on the obtained correlation coefficient values and the reference value (143), and accumulate and store the generated identification signal. When storing the identification signal, the energy storage system 1 may be stored together with the identification information of the battery cell.

The energy storage system 1 may obtain the Z-score for each of the plurality of battery cells 11a, generate the identification signal based on the obtained Z-score and the reference Z-score (143), and accumulate and store the generated identification signal. When storing the identification signal, the energy storage system may be stored together with the identification information of the battery cell. Here, the Z-score 3 may be the reference Z-score.

More particularly, the energy storage system 1 may compare the values of correlation coefficients obtained for each battery cell with the reference value, and generate the first identification signal when the obtained correlation coefficient value is greater than or equal to the reference value, and generate the second identification signal when the obtained correlation coefficient value is less than the reference value.

The energy storage system 1 may compare the Z-score obtained for each battery cell with the reference Z-score, and generate the first identification signal when the obtained Z-score is less than or equal to the reference Z-score, and generate the second identification signal when the obtained Z-score is greater than the reference Z-score.

Here, the first identification signal may be zero (0), and the second identification signal may be one (1). In addition, when the first identification signal is one (1), the second identification signal may be zero (0).

The energy storage system may determine whether each battery cell has failed by calculating the Z-score of the battery cells 11a and relatively evaluating the voltage deviation of the battery cells 11a.

In addition, the energy storage system may determine whether operating states of the battery cells 11a are the same or similar to each other by calculating the correlation coefficient between the battery cells 11a. That is, the energy storage system may determine whether the battery cells 11a operate with the same tendency.

The energy storage system 1 may determine whether the second identification signal exists among the generated identification signals (144), and when it is determined that the second identification signal exists, in response to the generation of the second identification signal, the energy storage system 1 may identify the identification of the battery cell related to the generation of the second identification signal (145), and may store the identified identification information of the battery cell and the second identification signal together.

The energy storage system 1 may determine whether or not each battery cell has the abnormal state and the risk of failure based on the accumulated and stored identification signal.

More particularly, the energy storage system 1 may identify the battery cell in which the second identification signal exists for each battery cell, and recognize the battery cell in which the second identification signal exists as the battery cell in the abnormal state.

The energy storage system 1 may determine that the risk of failure of the battery cell is greater than or equal to the reference risk based on the number of accumulated storage times of the second identification signal for each battery cell (146).

That is, the energy storage system 1 may identify a cumulative storage number of the second identification signal for each battery cell. When the cumulative storage number is less than or equal to a reference number, the energy storage system 1 may determine that the risk of the battery cell is less than the reference risk, and output warning information about the warning (147).

On the other hand, the energy storage system 1 may determine that the risk of the battery cells is greater than or equal to the reference risk when the determined cumulative storage number exceeds the reference number, and block the operation of the battery system related to battery charging and discharging (148).

In addition, the energy storage system 1 may determine the risk of failure according to the cumulative frequency of the second identification signal.

According to the embodiment of the disclosure, by defining the correlation of an operating state between battery cells 11a as the correlation coefficient and monitoring the state of the battery cells 11a based on the correlation coefficient, it is possible to effectively monitor the state of individual battery cells in the battery composed of the plurality of battery cells 11a.

The disclosure may diagnose battery cells failure through monitoring, thereby preventing the battery failure in advance.

According to the embodiment of the disclosure, when at least one battery cell malfunctions, by generating an identification signal for the battery cell that has performed an abnormal operation and monitoring it cumulatively, a failure of the individual battery cell exhibiting an operation characteristic different from that of other battery cells may be diagnosed, but before the battery cell reaches a dangerous state.

According to the embodiment of the disclosure, accidents such as fire and explosion due to continuous energy release and temperature increase may be prevented in advance by diagnosing a failure of at least one battery cell before a thermal runaway phenomenon in at least one battery cell proceeds.

According to the embodiment of the disclosure, even for parallel-connected battery cells (when the cell in question with a + and the cell in question with a − are present), by monitoring a trend value/trend change, it is possible to estimate a parallel connection group (i.e., a parallel connection position where an abnormality occurs).

In this way, the disclosure may prevent a fire caused by the battery.

The disclosure may improve the quality and marketability of the battery management apparatus and the energy storage system, and further improve user satisfaction, improve user convenience, reliability and safety, and secure product competitiveness.

The disclosed embodiments may be implemented in the form of a recording medium storing computer-executable instructions that are executable by a processor. The instructions may be stored in the form of a program code, and when executed by a processor, the instructions may generate a program module to perform operations of the disclosed embodiments. The recording medium may be implemented non-transitory as a non-transitory computer-readable recording medium.

The non-transitory computer-readable recording medium may include all types of recording media storing commands that may be interpreted by a computer. For example, the non-transitory computer-readable recording medium may be, for example, ROM, RAM, a magnetic tape, a magnetic disc, flash memory, an optical data storage device, and the like.

Embodiments of the disclosure have thus far been described with reference to the accompanying drawings. It should be apparent to those of ordinary skill in the art that the disclosure may be practiced in other forms than the embodiments as described above without changing the technical idea or essential features of the disclosure. The above embodiments are only by way of example, and should not be interpreted in a limited sense.

What is claimed is:

1. A battery management apparatus comprising:
a battery including a plurality of battery cells connected to one another in at least one of a series connection or a parallel connection;
a voltage detector configured to detect a voltage of each of the plurality of battery cells, and detect a total voltage of the battery;
a monitor configured to:
when the total voltage of the battery and the voltage of each battery cell are received, accumulate and store the total voltage of the battery and the voltage of each battery cell based on a received time,
obtain an average value of the total voltage accumulated and stored for a predetermined time,
obtain an average value of the voltage of each battery cell accumulated and stored for the predetermined time,
obtain a covariance and a product of a standard deviation of each battery cell using the average value of the accumulated total voltage and the average value of the accumulated voltage of each battery cell,
obtain a correlation coefficient value of each battery cell based on the obtained covariance and the obtained product of the standard deviation of each battery cell,
generate a first identification signal for the correlation coefficient value of each battery cell greater than or equal to a reference value, and
generate a second identification signal for the correlation coefficient value of each battery cell less than the reference value based on the received time; and
a storage configured to store second identification signals among the first and second identification signals generated by the monitor for each of the plurality of battery cells based on the received time,
wherein the monitor is configured to recognize a risk of failure of each of the plurality of battery cells based on a number of the second identification signals stored in the storage for each of the plurality of battery cells.

2. The battery management apparatus according to claim 1, further comprising:
a current detector configured to detect a current of each of the plurality of battery cells; and
a temperature detector configured to detect a temperature of at least one battery cell,
wherein the monitor is configured to obtain at least one of a state of charge (SOC), a state of health (SOH), an internal resistance, and a capacity change corresponding to a voltage change of a battery based on the current, voltage, and temperature of each of the plurality of battery cells, and to obtain the values of correlation coefficient between the plurality of battery cells based on at least one of the SOC, SOH internal resistance, and the capacity change corresponding to the voltage change of the battery.

3. The battery management apparatus according to claim 1, wherein the monitor is configured to determine a repeatability and a frequency of the accumulated number of the second identification signals for each of the plurality of battery cells based on the received time.

4. An energy storage system comprising:
a battery including a plurality of battery cells connected to one another in at least one of a series connection or a parallel connection;
a voltage detector configured to detect a voltage of each of the plurality of battery cells, and detect a total voltage of the battery;
a battery management apparatus configured to:
when the total voltage of the battery and the voltage of each battery cell are received, accumulate and store the total voltage of the battery and the voltage of each battery cell based on a received time,
obtain an average value of the total voltage accumulated and stored for a predetermined time,
obtain an average value of the voltage of each battery cell accumulated and stored for the predetermined time,
obtain a covariance and a product of a standard deviation of each battery cell using the average value of the accumulated total voltage and the average value of the accumulated voltage of each battery cell,
obtain a correlation coefficient value of each battery cell based on the obtained covariance and the obtained product of the standard deviation of each battery cell,
generate a first identification signal for the correlation coefficient value of each battery cell greater than or equal to a reference value, and generate a second identification signal for the correlation coefficient value of each battery cell less than the reference value based on the received time,
store second identification signals among the first and second identification signals generated by the battery management apparatus for each of the plurality of battery cells based on the received time, and
recognize a risk of failure of each of the plurality of battery cells based on a number of the second identification signals stored for each of the plurality of battery cells;
a controller configured to control an output of warning information based on the risk of failure of each of the plurality of battery cells, and to block charge/discharge of the plurality of battery cells; and
a display configured to display the warning information based on a control command of the controller.

5. The energy storage system according to claim 4, further comprising:
a current detector configured to detect a current of each of the plurality of battery cells; and
a temperature detector configured to detect a temperature of at least one battery cell,
wherein the battery management apparatus is configured to obtain at least one of a state of charge (SOC), a state of health (SOH), an internal resistance, or a capacity change corresponding to a voltage change of a battery based on the current, voltage, and temperature of each of the plurality of battery cells, and to obtain the values of correlation coefficient between the plurality of battery cells based on at least one of the SOC, SOH, internal resistance, or the capacity change corresponding to the voltage change of the battery.

6. The energy storage system according to claim 4, wherein the battery management apparatus is configured to determine the repeatability and frequency of the number of the second identification signals for each of the plurality of battery cells stored in the storage based on the received time.

7. The energy storage system according to claim 4, wherein the battery management apparatus is configured to manage a battery module in which the plurality of battery cells are connected in series and in parallel.

8. The energy storage system according to claim 4, wherein:
the battery management apparatus is configured to manage a battery rack including a plurality of battery modules connected in series and in parallel; and
each of the plurality of battery modules comprises battery cells connected in series and in parallel.

9. An energy storage system comprising:
a battery including a plurality of battery cells connected to one another in at least one of a series connection or a parallel connection;
a voltage detector configured to detect a voltage of each of the plurality of battery cells;
a battery management apparatus configured to:
obtain the voltage of each of the plurality of battery cells and values of correlation coefficient corresponding to correlation results obtained based on the voltage,
obtain an average value and a standard deviation based on the voltage of each of the plurality of battery cells,
obtain a standardized score (Z-score) of each of the plurality of battery cells based on the voltage, the average value, and the standard deviation of each of the plurality of battery cells,
generate identification signal corresponding to each of the plurality of battery cells based on the values of correlation coefficient for each of the plurality of battery cells and the Z-score,
generate a first identification signal for the obtained value of the correlation coefficient of each battery cell greater than or equal to a reference value,
generate a second identification signal for the obtained value of the correlation coefficient of each battery cell less than the reference value, and
monitor a risk of failure of each of the plurality of battery cells based on the second identification signal corresponding to each of the plurality of battery cells,
a controller configured to control an output of warning information based on the risk of failure of each of the plurality of battery cells, and to block charge/discharge of the plurality of battery cells; and
a display configured to display the warning information based on a control command of the controller.

10. The energy storage system according to claim 9, wherein:
the battery management apparatus is further configured to:
obtain voltages of the plurality of battery cells based on the voltage signal of each of the plurality of battery cells,
obtain a total voltage based on the voltages of the plurality of battery cells, and
obtain the value of correlation coefficient of each of the plurality of battery cells with respect to the total voltage.

11. The energy storage system according to claim 9, wherein:
the battery management apparatus is configured to:
generate the first identification signal when the obtained Z-score is less than or equal to a reference Z-score, and generate the second identification signal when the obtained Z-score is greater than the reference Z-score.

12. The energy storage system according to claim 11, wherein
the battery management apparatus is configured to recognize the risk of failure of each of the plurality of battery cells based on the number of second identification signals for each of the plurality of battery cells.

* * * * *